(12) United States Patent
Togo

(10) Patent No.: US 6,300,211 B1
(45) Date of Patent: Oct. 9, 2001

(54) HIGHLY RELIABLE TRENCH CAPACITOR TYPE MEMORY CELL

(75) Inventor: Mitsuhiro Togo, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/633,344

(22) Filed: Aug. 4, 2000

Related U.S. Application Data

(62) Division of application No. 09/157,537, filed on Sep. 21, 1998.

(30) Foreign Application Priority Data

Sep. 22, 1997 (JP) .................................................. 9-256990

(51) Int. Cl.⁷ .................................................. H01L 21/20
(52) U.S. Cl. .................................................. 438/386; 438/734
(58) Field of Search .................................. 438/243, 246, 438/386, 389, 734

(56) References Cited

U.S. PATENT DOCUMENTS

| | | |
|---|---|---|
| 4,801,988 | 1/1989 | Kenney . |
| 5,097,381 | 3/1992 | Vo . |
| 5,262,002 * | 11/1993 | Grewal et al. ............ 438/386 |
| 5,395,786 * | 3/1995 | Hsu et al. ............ 438/386 |
| 5,543,348 | 8/1996 | Hammerl et al. . |
| 5,658,816 * | 8/1997 | Rajeevakumar ............ 438/386 |
| 5,692,281 * | 12/1997 | Rajeevakumar ............ 438/246 |
| 5,936,271 | 8/1999 | Alsmeier et al. . |
| 6,008,104 * | 12/1999 | Schrems ............ 438/386 |
| 6,063,658 * | 5/2000 | Horak et al. ............ 438/248 |
| 6,100,132 * | 8/2000 | Sato et al. ............ 438/243 |

FOREIGN PATENT DOCUMENTS

| | | |
|---|---|---|
| 1-173714 | 7/1989 | (JP) . |
| 1-243460 | 9/1989 | (JP) . |
| 5-283638 | 10/1993 | (JP) . |
| 8-88331 | 4/1996 | (JP) . |
| 8-264769 | 10/1996 | (JP) . |
| 8-274280 | 10/1996 | (JP) . |

OTHER PUBLICATIONS

Nicky Chau–Chun Lu, et al., "A Substrate–Plate Trench–Capacitor (SPT) Memory Cell for Dynamic RAM's", *IEEE Journal of Solid–State Circuits*, vol. SC–21, No. 5, Oct. 1986, pp. 627–634.

* cited by examiner

*Primary Examiner*—Long Pham
*Assistant Examiner*—William David Coleman
(74) *Attorney, Agent, or Firm*—Sughrue, Mion, Zinn, Macpeak & Seas, PLLC

(57) ABSTRACT

In a trench capacitor type semiconductor memory device including a semiconductor substrate having a trench and first and second impurity diffusion source/drain regions, a capacitor electrode buried in the trench, and a substrate-side capacitor electrode and a capacitor insulating layer within the semiconductor substrate and adjacent to a lower portion of the capacitor electrode, a buried insulating layer is formed between the semiconductor substrate and an upper portion of the capacitor electrode. The buried insulating layer is thicker than the capacitor insulating layer. However the buried insulating layer on a surface of the second impurity diffusion source/drain region is thin, or in direct contact with the capacitor electrode. A silicide layer is formed on the second impurity diffusion source/drain region and the capacitor electrode.

8 Claims, 22 Drawing Sheets

HIGHLY RELIABLE TRENCH CAPACITOR TYPE MEMORY CELL

This is a divisional of application Ser. No. 09/157,537 filed Sept. 21, 1998, the disclosure of which is incorporated herein by reference now allowed.

BACKGROUND OF THE INVENTION

1. Field of the Invention

The present invention relates to a semiconductor memory device, and more particularly, to a trench capacity type memory cell of a dynamic random access memory (DRAM) device.

2. Description of the Related Art

A memory cell of a DRAM device is constructed by a single transfer gate transistor and a single capacitor to make the device simple. Such a structure is widely used as it is suitable for highly integrated DRAMs. Three-dimensionally configured capacitors have been developed and used for such memory cells to realize a higher degree of integration for DRAM devices.

The three-dimensionally configured capacitors of the memory cell of a DRAM device may be either of a stacked structure or of a trenched structure. While these structures have respective advantages and disadvantages, the trenched structure is advantageous from the viewpoint of realizing an excellent flatness for the surface of the device and hence can effectively be used for a system-on-silicon type semiconductor device including both logic circuits and memory circuits.

Various possible structural alternatives have been studied for capacitors of the trenched structure. One of such alternatives is realized by forming a cell plate electrode on the silicon substrate side for the capacitor and a capacitor electrode in the inside of a trench to provide strong resistance against noises caused by incident α-rays and/or coming from the circuit. This capacitor will be referred to as a substrate plate type trench capacitor.

In a memory cell formed by a single substrate plate type trench capacitor and a single transfer gate transistor, the impurity diffusion source/drain region of the transfer gate transistor and the capacitor electrode are required to be electrically connected with each other. Various techniques have been proposed to realize the electrical connection.

In a first prior art substrate-plate trench capacitor type memory cell (see JP-A-1-173714), a selective monocrystalline silicon layer is epitaxially grown to bridge over the source/drain region and the capacitor electrode. As a result, the selective silicon layer electrically connects the source/drain region and the capacitor electrode. This will be explained later in detail.

In the above-described first prior art memory cell, a capacitor insulating layer is so thin as to increase the capacitance of the substrate plate type trench capacitor. As a result, the selective silicon layer can bridge over the source/drain region and the capacitor electrode. Thus, under certain conditions, a parasitic MOS transistor can appear in the device. As a result, a leakage current may flow through the parasitic MOS transistor. If the capacitor insulating layer is thickened, such a parasitic MOS transistor can be prevented from becoming operational in the device. In this case, however, it will be difficult to grow the selective silicon layer and realize a reliable electric connection between the source/drain region and the capacitor electrode.

In a second prior art substrate-plate trench-capacitor type memory cell (see-JP-8-88331), a thick insulating layer is formed on the lateral walls in an upper portion of a trench, while a capacitor insulating layer is formed on the lateral walls of the trench in a lower portion of the trench. Also, an anti-inversion layer (channel stopper) is formed on the outer periphery of the trench, and a source/drain region and the capacitor electrode are electrically connected by a connection electrode which is arranged on the top of the thick insulating layer. This also will be explained later in detail.

In the above-described second prior art memory cell, the pattern of the connection electrode is formed by means of a photolithography and etching process. However, as the memory cell is down-sized, the distance between the source/drain region and the capacitor electrode is reduced, which makes it difficult to form a pattern for the connection electrode. Thus, it is difficult to down-size the memory cell so long as the connection electrode is used.

SUMMARY OF THE INVENTION

It is an object of the present invention to provide a trench capacitor type memory cell that can improve the reliability and down-size the device.

Another object is to provide a method for manufacturing the above-mentioned memory cell.

According to the present invention, in a trench capacitor type semiconductor memory device including a semiconductor substrate having a trench and first and second impurity diffusion source/drain regions, a capacitor electrode buried in the trench, and a substrate-side capacitor electrode and a capacitor insulating layer within the semiconductor substrate and adjacent to a lower portion of the capacitor electrode, a buried insulating layer is formed between the semiconductor substrate and an upper portion of the capacitor electrode. The buried insulating layer is thicker than the capacitor insulating layer. However, the buried insulating layer on a surface of the second impurity diffusion source/drain region is thin, or in direct contact with the capacitor electrode. A silicide layer is formed on the second impurity diffusion source/drain region and the capacitor electrode.

Since the buried insulating layer is thick, the generation of a parasitic MOS transistor can be suppressed. In addition, since the source/drain region and the capacitor electrode are in contact with each other through a thin portion of the buried insulating layer, or they are in direct contact with each other, the silicide layer can easily bridge over the source/drain region and the capacitor electrode.

BRIEF DESCRIPTION OF THE DRAWINGS

The present invention will be more clearly understood from the description as set forth below, as compared with the prior art, with reference to the accompanying drawings, wherein.

DESCRIPTION OF THE PREFERRED EMBODIMENT

Before the description of the preferred embodiment, prior art substrate-plate trench-capacitor type memory cells will be explained with reference to FIGS. 1 and 2.

Figure 1:
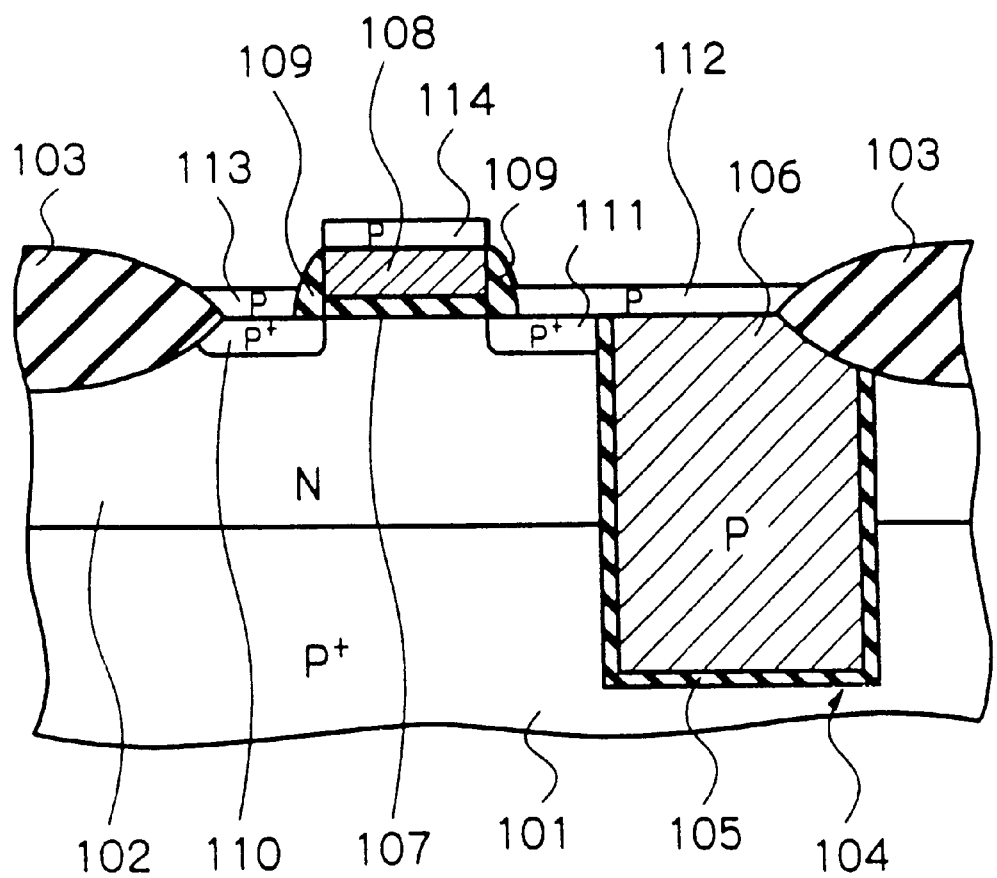
FIG. 1 is a cross-sectional view illustrating a first prior art substrate-plate trench-capacitor type memory cell.

In FIG. 1, which illustrates a first prior art substrate-plate trench-capacitor type memory cell (see JP-A-1-173714), an N-type well 102 is formed on a $P^+$-type monocrystalline silicon substrate 101. A field silicon oxide layer 103 is formed on the surface of the N-type well 102. A transfer gate transistor and a substrate plate type trench capacitor are formed in a region surrounded by the field silicon oxide layer 103.

Then, a trench 104 is formed within the monocrystalline silicon substrate 101 and the N-type well 102, and a capacitor insulating layer 105 is formed on the inner walls of the trench 104. The trench 104 is filled with P-type impurity doped polycrystalline silicon layer 106. Thus, a substrate plate type trench capacitor is formed.

Then, a gate insulating layer 107 is formed on the surface of the N-type well 102, and a gate polycrystalline silicon layer 108 is formed on the gate insulating layer 107. Sidewall spacers 109 are formed on the lateral surfaces of the gate polycrystalline silicon layer 108 and the gate insulating layer 107.

Then, $P^+$-type impurity diffusion source/drain regions 110 and 111 are formed within the N-type layer 102, so that the gate polycrystalline silicon layer 108 is interposed between them. Thus, a transfer gate transistor is formed.

Then, a selective monocrystalline silicon layer 112 is epitaxially grown by a chemical vapor deposition (CVD) process using a mixture gas of $SiH_2Cl_2$ and HCl to bridge over the source/drain region 111 and the P-type impurity doped polycrystalline silicon layer 106. As a result, the selective silicon layer 112 electrically connects the source/drain region 111 and the P-type impurity doped polycrystalline silicon layer 106. Note that selective monocrystalline silicon layers 113 and 114 are also grown simultaneously with the selective monocrystalline silicon layer 112.

A silicide layer made of refractory metal may be formed in self-alignment with the selective silicon layers 112, 113 and 114 to reduce the resistance thereof.

In the memory cell of FIG. 1, the capacitor insulating layer 104 formed on the lateral sides of an upper portion of the trench 104 is so thin as to increase the capacitance of the substrate plate type trench capacitor. As a result, the selective monocrystalline silicon layer 112 can bridge over the source/drain region 111 and the P-type impurity diffusion doped polycrystalline silicon layer 106. Thus, under certain conditions, a parasitic MOS transistor can appear in the device, where the capacitor insulating layer 105 operates as a gate insulating layer and the P-type impurity doped polycrystalline silicon layer 106 operates as a gate electrode, whereas the source/drain region 111 and the monocrystalline silicon substrate 101 operate as source/drain regions. As a result, a leakage current may flow through the parasitic MOS transistor. If the capacitor insulating layer 105 is thickened, such a parasitic MOS transistor can be prevented from becoming operational in the device. In this case, however, it will be difficult to grow the selective monocrystalline silicon layer 112 and realize a reliable electric connection between the source/drain region 111 and the P-type impurity doped polycrystalline silicon 106.

Figure 2:
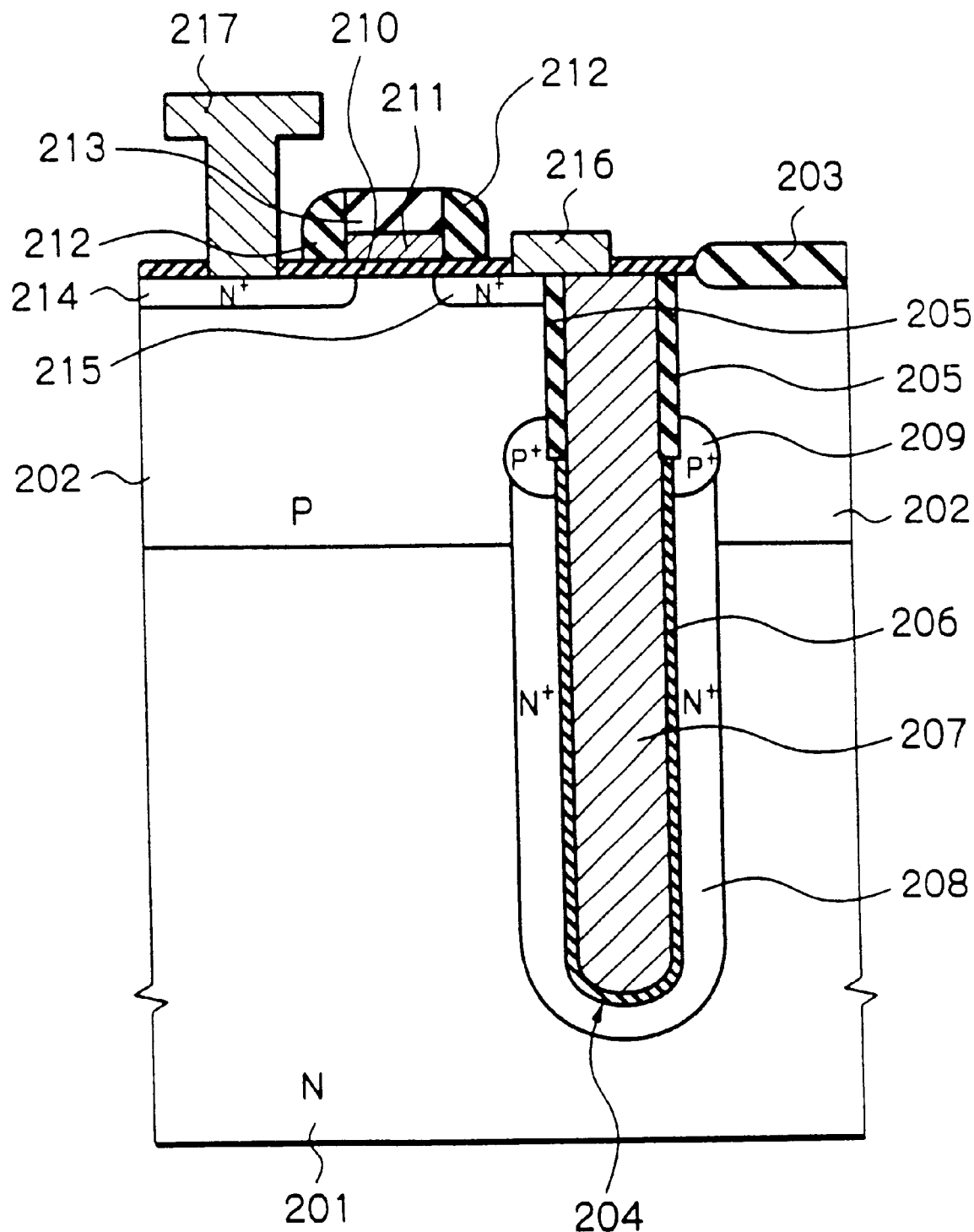
FIG. 2 is a cross-sectional view illustrating a second prior art substrate-plate trench-capacitor type memory cell.

In FIG. 2, which illustrates a second prior art substrate-plate trench-capacitor type memory cell (see-JP-8-88331), a P-type well 202 is formed on an N-type monocrystalline silicon substrate 201.

Then, a field silicon oxide layer 203 is formed on the surface of the P-type well 202, and a transfer gate transistor and a substrate plate type trench capacitor are formed in a region surrounded by the field silicon oxide layer 203.

Then, a trench 204 is formed into the N-type silicon substrate 201 and the P-type well 202. Also, a thick silicon oxide layer 205 is formed on the lateral walls in an upper portion of the trench 204. A capacitor insulating layer 206 is formed on the inner walls of the trench 204 in the area not covered by the silicon oxide layer 205. A capacitor electrode 207 is buried in the trench 204. Additionally, an $N^+$-type impurity diffusion layer 208 is arranged on the outer periphery of the lower portion of the trench 204 to operate as a cell plate electrode. A $P^+$-type anti-inversion layer (channel stopper) 209 is formed on the top of the $N^+$-type impurity diffusion layer 208 on the outer periphery of the trench 204. Thus, a substrate plate type trench capacitor is formed.

Then, a gate insulating layer 210 is formed on the surface of the P-type well 202 and a gate electrode 211 is formed on the gate insulating layer 210. Sidewall spacers 212 are formed on the lateral surfaces of the gate electrode 211 and then a protective insulating layer 213 is formed on the top surface of the gate electrode 211. Then, $N^+$-type impurity diffusion source/drain regions 214 and 215 are formed such that the gate electrode 211 is interposed between them. Thus, a transfer gate transistor is formed.

The source/drain region 215 and the capacitor electrode 207 are electrically connected by a connection electrode 216. On the other hand, the source/drain region 214 is electrically connected to a bit line 217. Note that the connection electrode 216 is arranged on the top of the thick silicon oxide layer 205.

In FIG. 2, the pattern of the connection electrode 216 is formed by means of a photolithography and etching process. However, as the memory cell is down-sized, the distance between the source/drain region 215 and the capacitor electrode 207 for interposing the sidewall spacer 212 therebetween is reduced, which makes it difficult to form a pattern for the connection electrode 216. Thus, it is difficult to down-size the memory cell of FIG. 2 so long as the connection electrode 216 is used.

Figure 3:
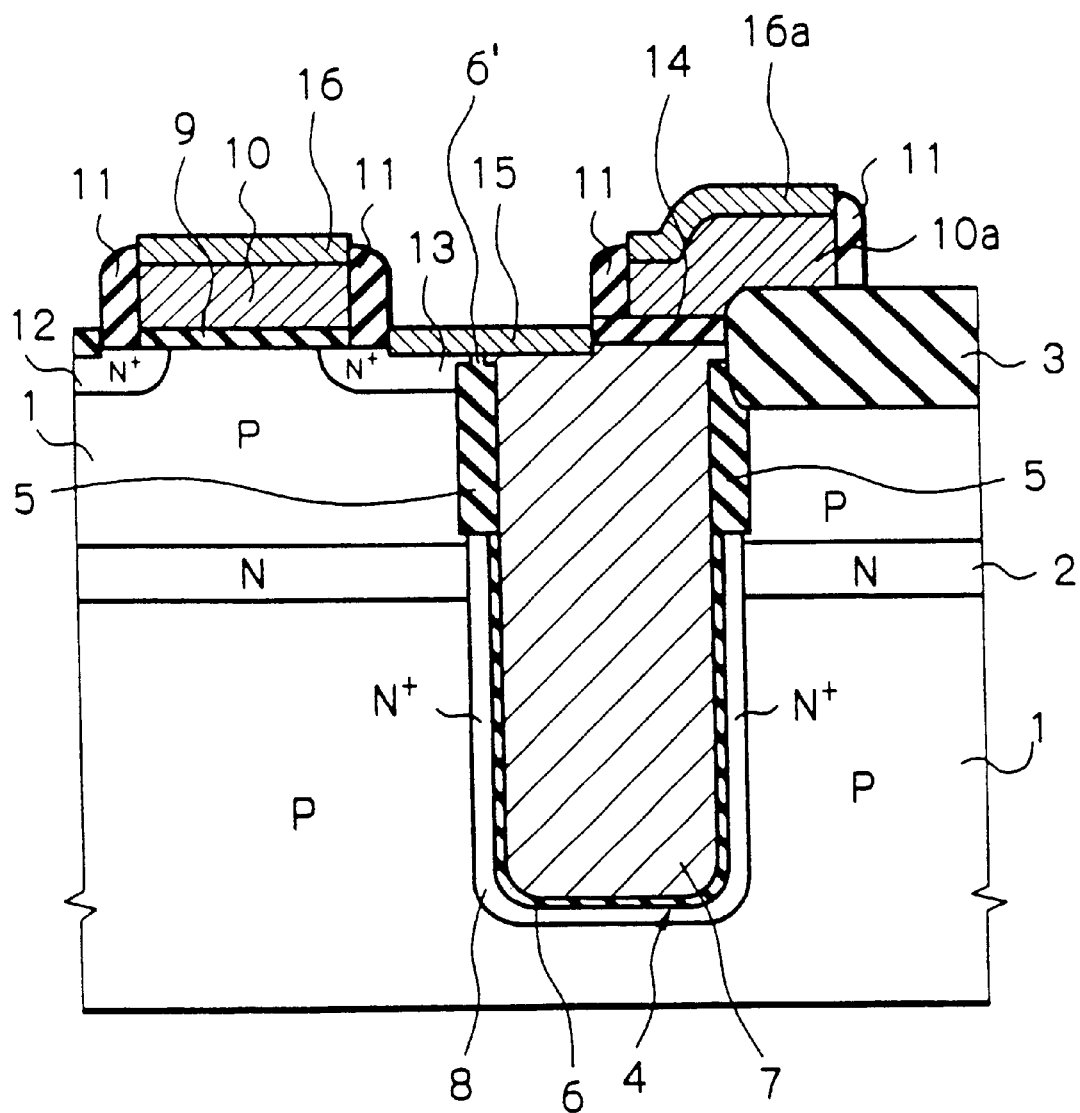
FIG. 3 is a cross-sectional view illustrating an embodiment of the substrate-plate trench-capacitor type memory cell according to the present invention.

In FIG. 3, which illustrates an embodiment of the substrate-plate trench-capacitor type memory cell according to the present invention, an N-type substrate plate electrode 2 is formed within a P-type monocrystalline silicon substrate 1.

A field silicon oxide layer 3 is formed on the surface of the silicon substrate 1. A transfer gate transistor and a substrate plate type trench capacitor are formed in a region surrounded by the field silicon oxide layer 3.

Then, a trench 4 is formed within the silicon substrate 1. A buried silicon oxide film layer 5 is formed in an upper portion of the sidewalls of the trench 4. More specifically, the buried silicon oxide layer 5 is buried into the silicon substrate at 50 nm to 150 nm from the main surface of the silicon substrate 1. The buried silicon oxide layer 5 has a thickness of between 20 nm and 100 nm.

Then, a capacitor insulating layer 6 is formed on the inner wall of the trench 4. A storage electrode 7 is buried in the trench 4 and is formed on the capacitor insulating layer 6. Additionally, an N+-type substrate-side capacitor electrode 8 is formed on the outer periphery of the trench 4 in a lower portion thereof. The substrate-side capacitor electrode 8 constitutes a cell-plate electrode of the memory cell along with the substrate plate electrode 2. Thus, a substrate plate type trench capacitor is formed.

Also, a gate insulating layer 9 is formed on the surface of the silicon substrate 1, and a gate polycrystalline silicon layer 10 is formed on the gate insulating layer 9. Sidewall spacers 11 are formed on the lateral surfaces of the gate polycrystalline silicon layer 10 and the gate insulating layer 9. Then, N+-type impurity diffusion source/drain regions 12 and 13 are formed within the silicon substrate 1, so that the gate polycrystalline silicon layer 10 is interposed between them. Thus, a transfer gate transistor is formed.

Then, the source/drain region 13 and the storage electrode 7 are electrically connected by means of a silicide layer 15. The silicide layer 15 for electric connection is formed between the sidewall spacers 11 in a self-aligning manner.

As illustrated in FIG. 3, the thickness of the buried silicon oxide layer 5 on the top thereof as indicated by reference numeral 6' is thin, for example, not greater than 10 μm. As a result, the silicide layer 15 is made to bridge the capacitor insulating layer 6. This is because silicide of titanium or other metal can easily be produced on the buried silicon oxide layer 5 on the thin portion thereof.

In FIG. 3, note that reference numeral 14 designates an isolation insulating layer. Also, a gate polycrystalline silicon layer 10a and a silicide layer 16a corresponding to the gate polycrystalline silicon layer 10 and the silicide layer 16, respectively, are used for an adjacent memory cell.

A first method for manufacturing the memory cell of FIG. 3 will be explained next with reference to FIGS. 4A through 4L as well as FIG. 3.

Figure 4A:
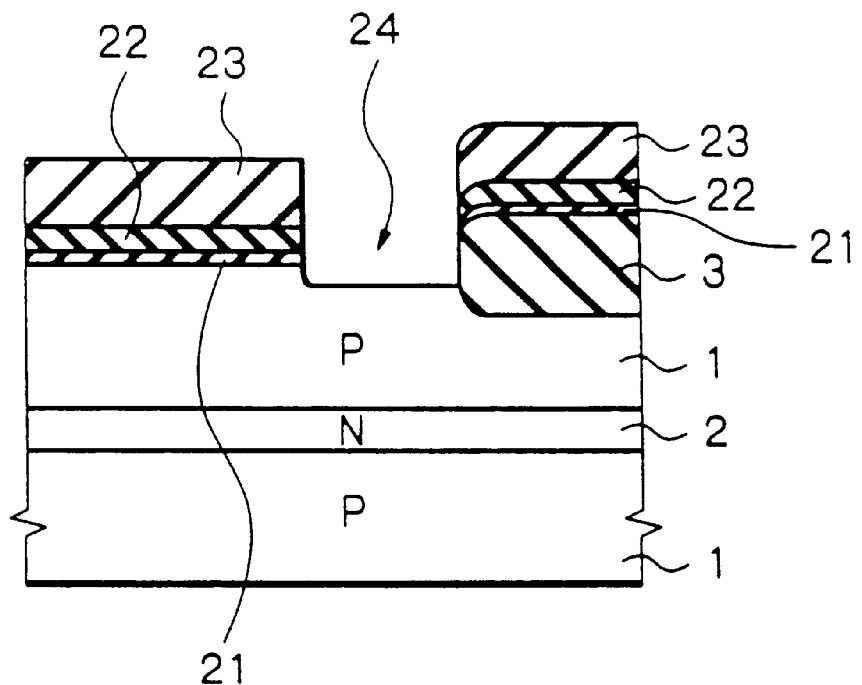
FIGS. 4A through 4L are cross-sectional views for explaining a first method for manufacturing the memory cell of FIG. 3.

First, referring to FIG. 4A, phosphorus ions are implanted at an energy of about 500 keV to 1 MeV into a P-type monocrystalline silicon substrate 1, and an annealing operation is performed thereupon. Thus, a substrate plate electrode 2 having a phosphorus concentration of about $10^{18}$ to $10^{19}$ atoms/cm$^3$ is formed within the silicon substrate 1.

Then, an about 500 nm thick field silicon oxide layer 3 is selectively formed on the surface of the silicon substrate 1 by using a local oxidation of silicon (LOCOS) process.

Then, an about 20 nm thick silicon oxide layer 21, an about 50 nm thick silicon nitride layer 22 and an about 500 nm thick mask silicon oxide layer 23 are sequentially formed to form a multilayer structure, which is then subjected to a patterning operation as illustrated in FIG. 4A. Thereafter, a trench 24 is formed within the silicon substrate 1 by a reactive ion etching (RIE) process. The trench 24 has a depth of about 50 nm to 150 nm.

Figure 4B:
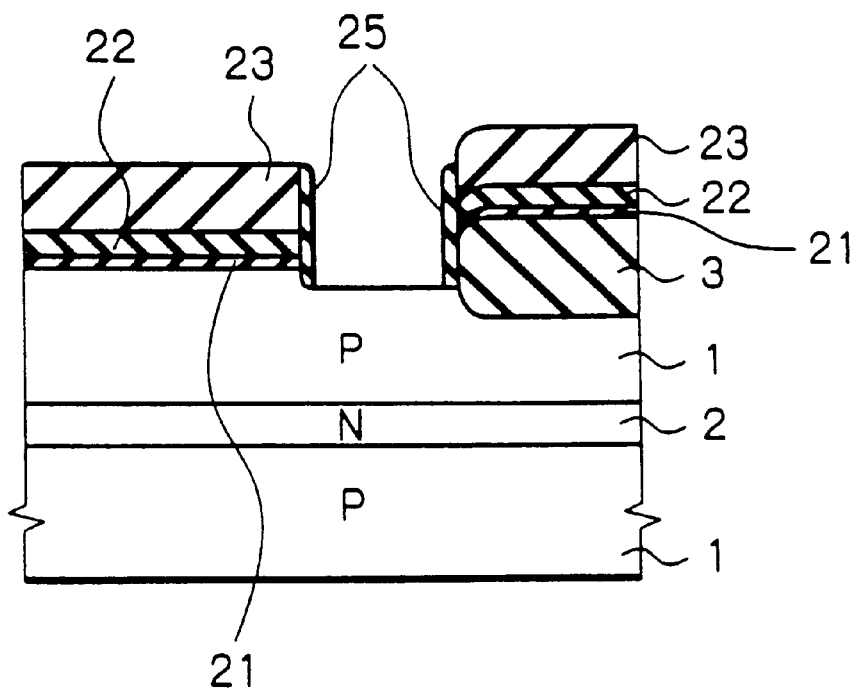

Next, referring to FIG. 4B, an about 50 nm thick sidewall insulating layer 25 made of silicon nitride is formed on the sidewalls of the silicon oxide layer 21, the silicon nitride layer 22, the mask silicon oxide layer 23 and the silicon substrate 1 within the trench 24.

Figure 4C:
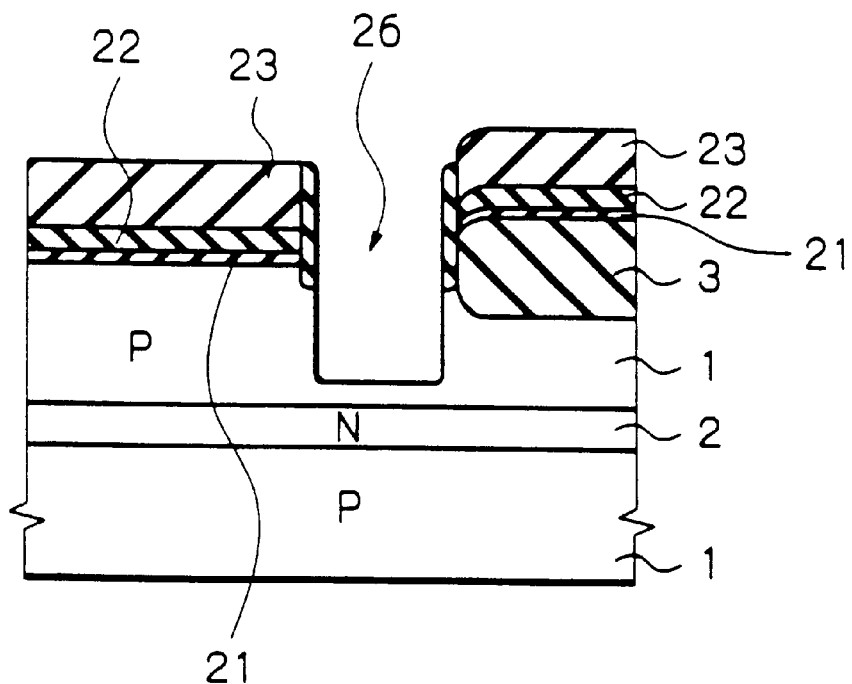

Next, referring to FIG. 4C, a dry etching operation using an RIE process is carried out once to further etch the botton of the trench 24. Thus, a trench 26 having a depth of about 0.5 μm to 1.5 μm is formed.

Figure 4D:
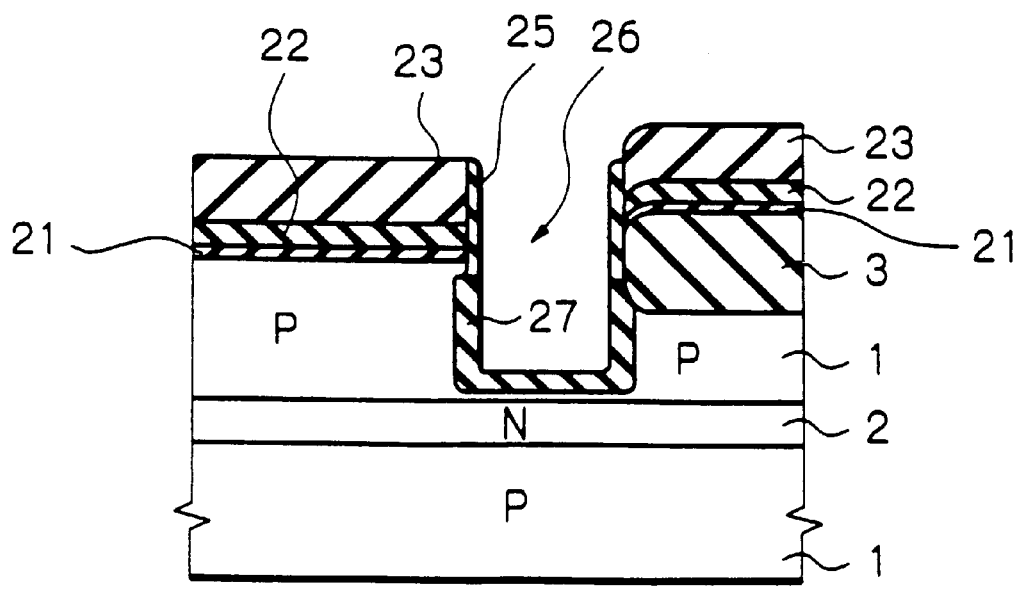

Next, referring to FIG. 4D, an about 20 to 100 rum thick silicon oxide layer 27 is thermally grown on the silicon substrate 1 within the trench 26. In this case, during the thermal oxidation process, an upper portion of the sidewalls of the trench 26 are masked by the sidewall silicon nitride layer 25, so that no thermal oxidation layer is formed on the upper portion of the sidewalls of the trench 26.

Figure 4E:
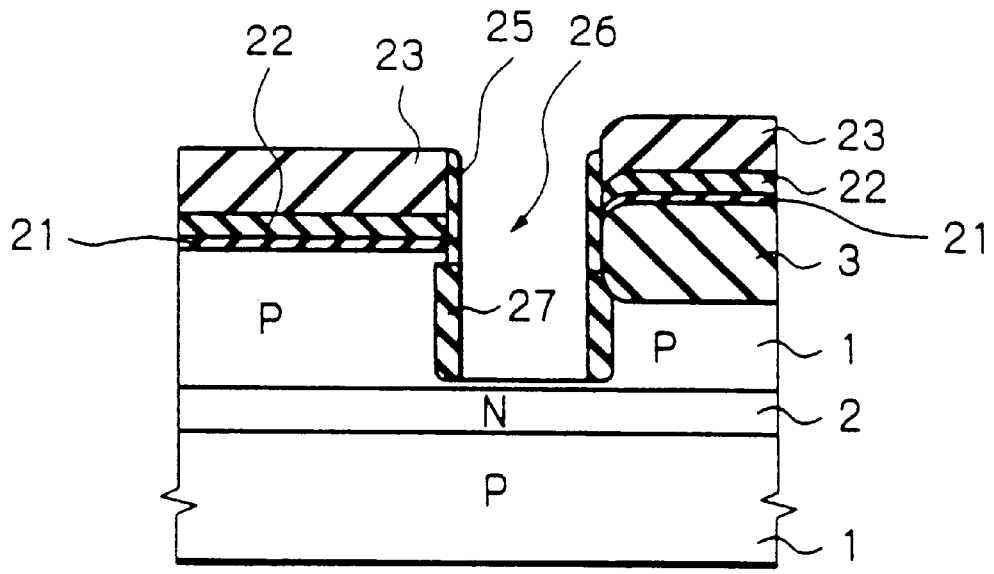

Next, referring to FIG. 4E, the silicon oxide layer 27 is etched back by means of an anisotropic dry etching process to remove only the bottom of the silicon oxide layer 27.

Figure 4F:
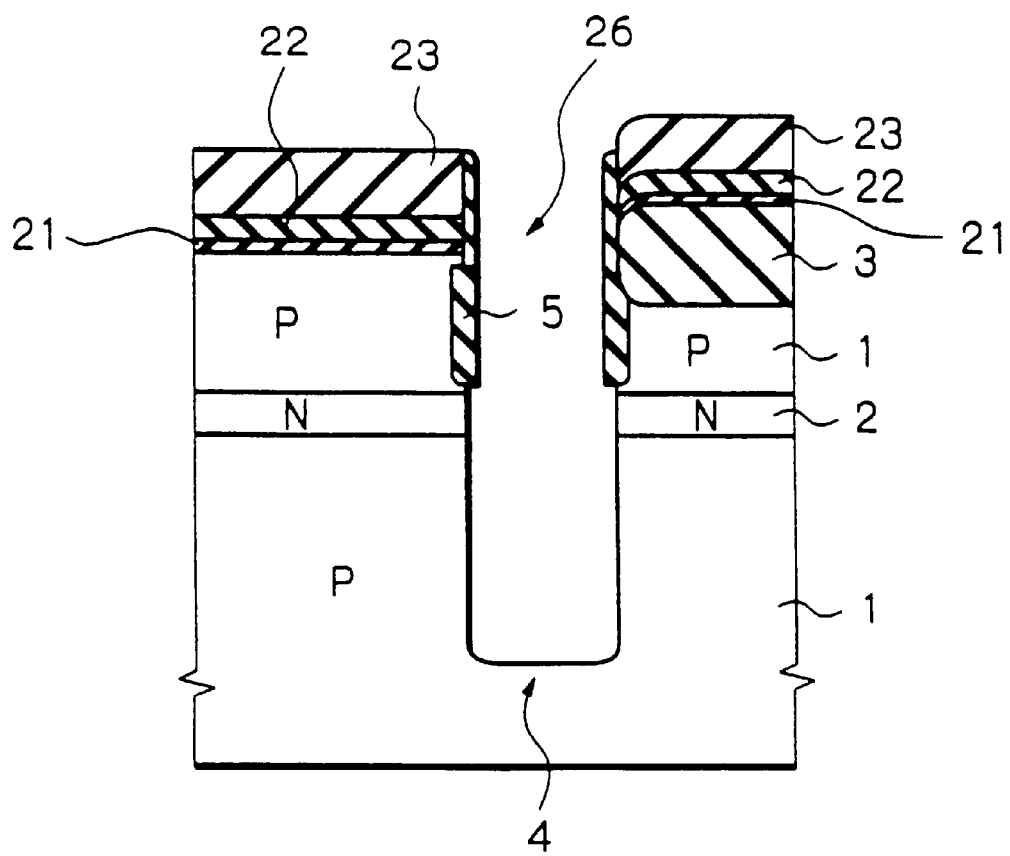

Next, referring to FIG. 4F, the silicon substrate 1 is once again subjected to a dry etching process using an RIE technique, to produce a trench 4. The trench 4 has a depth of about 5 μm. In this case, the silicon oxide layer 27 is buried as a buried silicon oxide layer 5 in the lateral walls of the trench 4 in an upper portion thereof.

Figure 4G:
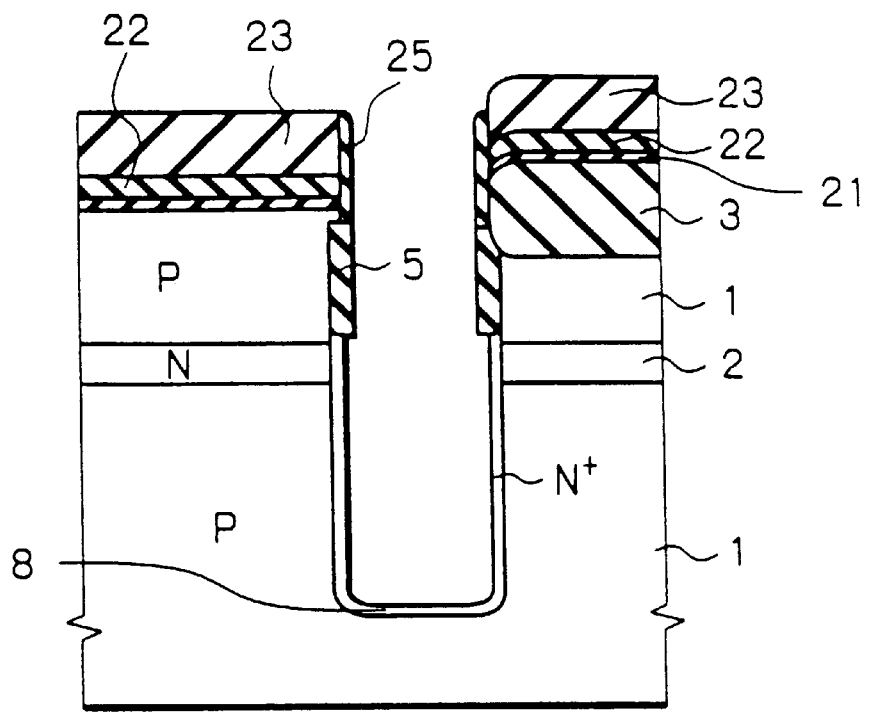

Next, referring to FIG. 4G, an about $10^{14}$ to $10^{15}$ arsenic ions/cm$^2$ are implanted by means of a rotational oblique ion implantation process into the silicon substrate 1 and the substrate plate electrode 2. Then, an annealing operation is carried out, so that a substrate-side capacitor electrode 8 is formed on the inner wall of the trench 4.

Figure 4H:
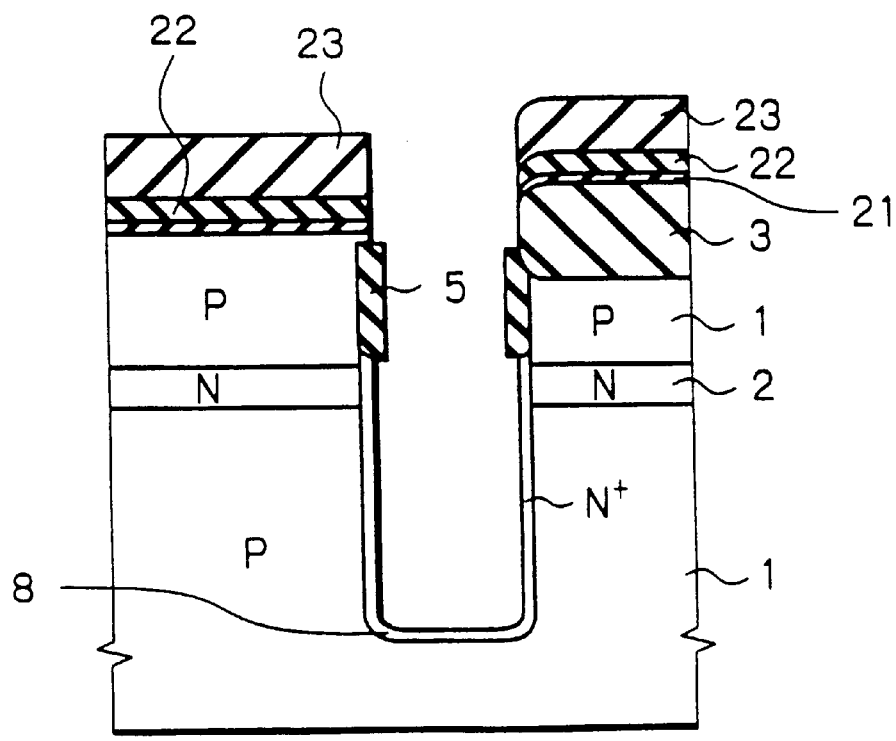

Next, referring to FIG. 4H, the sidewall silicon nitride layer 25 is removed by means of a hot phosphoric acid solution.

Figure 4I:
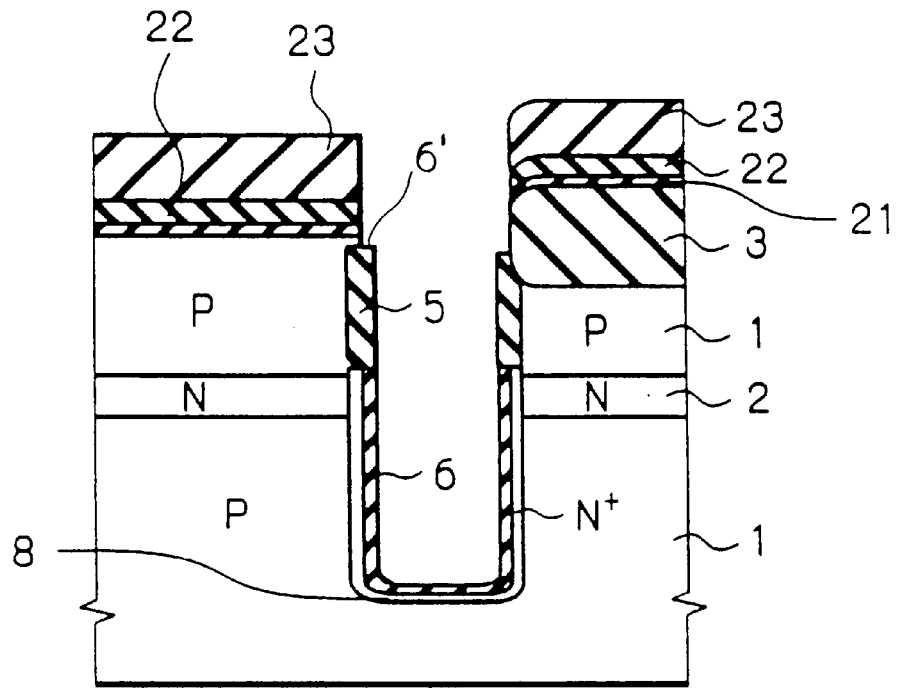

Next, referring to FIG. 4I, an about 10 nm thick capacitor insulating layers 6 and 6' made of silicon nitride is formed on the substrate-side capacitor electrode 8 and above the buried silicon oxide layer 5, respectively, using a CVD process.

Figure 4J:
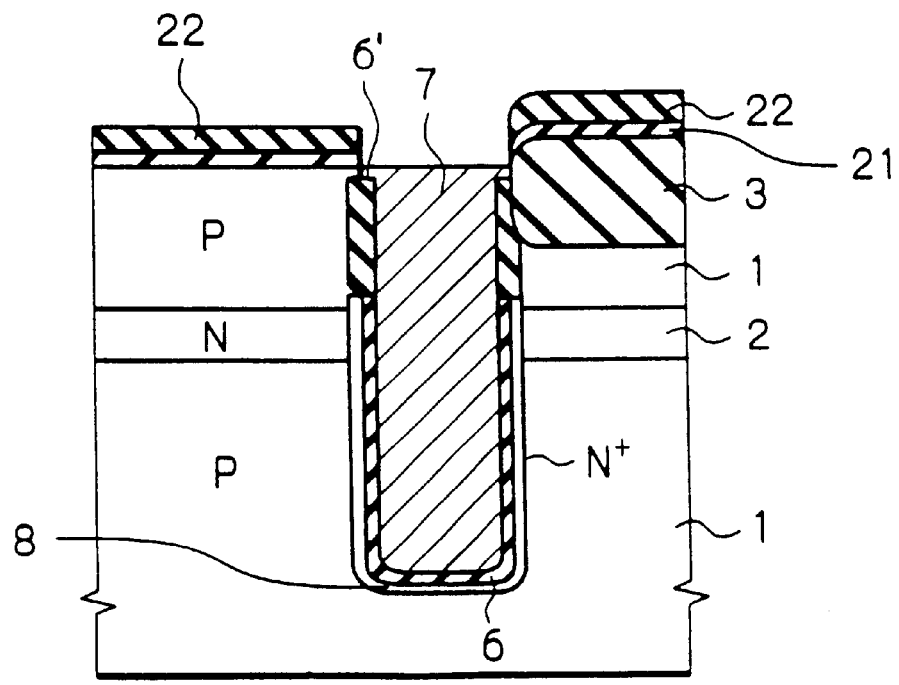

Next, referring to FIG. 4J, a phosphorus-including polycrystalline silicon layer is deposited on the entire surface by using a CVD process. In this case, the concentration of phosphorus in the polycrystalline silicon layer is about $10^{20}$ atoms/cm$^3$. Then, the polycrystalline silicon layer is etched back by a dry etching process, so that a capacitor electrode 7 is buried in the trench 4. In this case, the silicon oxide layer 23 is also removed. Note that a chemical mechanical polishing (CMP) process can be used instead of the dry etching process.

Figure 4K:
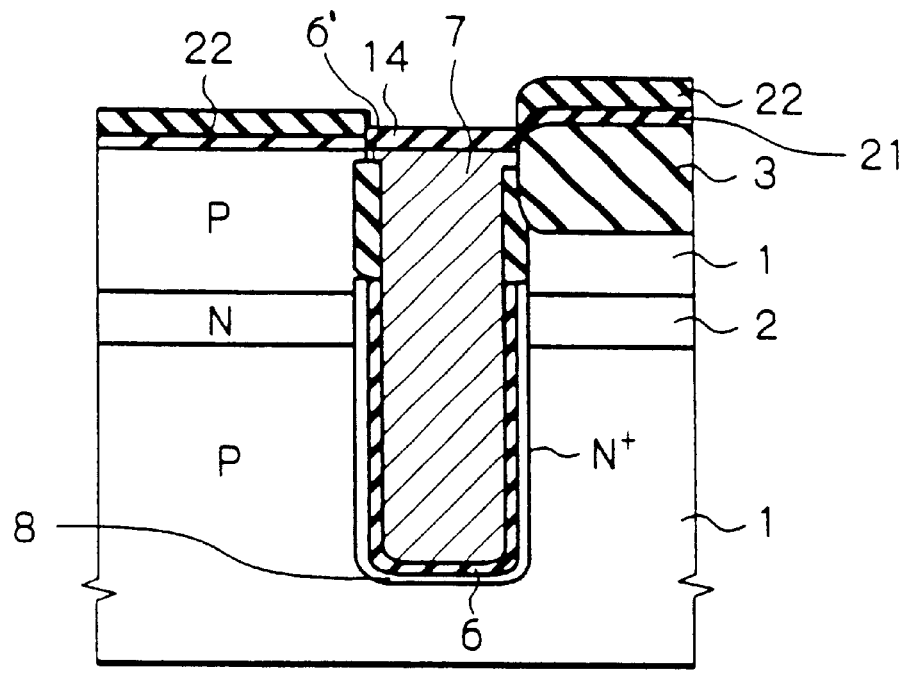

Next, referring to FIG. 4K, an about 50 nm thick isolation insulating layer 14 made of silicon oxide is thermally grown on the capacitor electrode 7 by using the silicon nitride layer 22 as a mask. Then, the silicon nitride layer 22 is removed by means of hot phosphoric acid solution, and the silicon oxide layer 21 is also removed by means of fluoric acid solution.

Figure 4L:
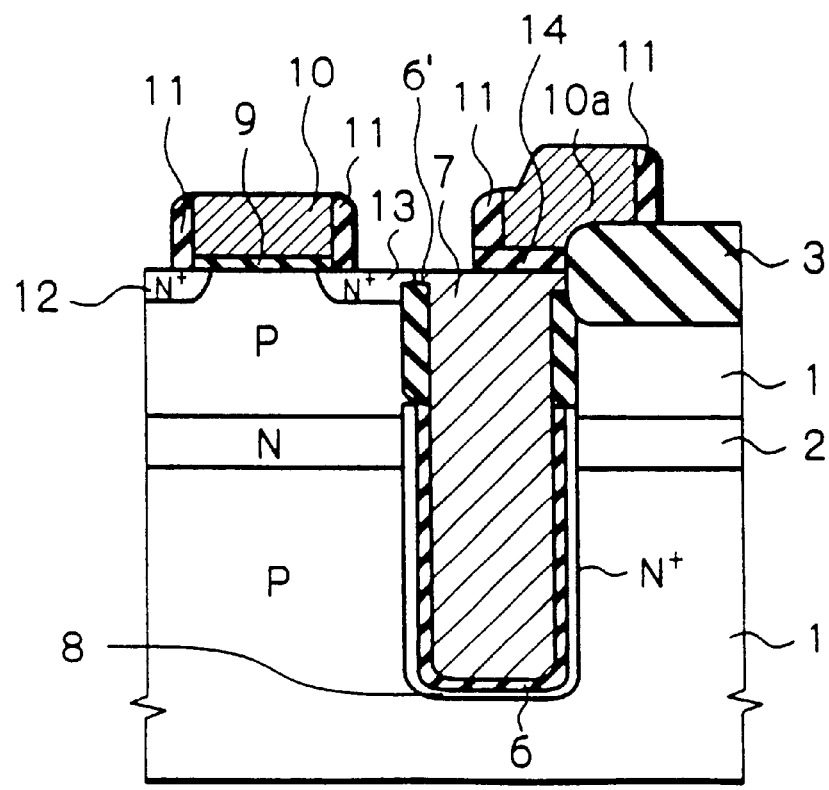

Next, referring to FIG. 4L, an about 6 nm thick silicon oxide layer is thermally grown on the silicon substrate 1, and then, a polycrystalline silicon layer is deposited on the silicon oxide layer by a CVD process. Then, the polycrystalline silicon layer and the silicon oxide layer are patterned, so that a gate insulating layer 9 and a gate polycrystalline silicon layer 10 are formed. Then, sidewall spacers 11 are formed on the lateral walls of the gate polycrystalline silicon layer 10 and the gate insulating layer 9 by deposition of a silicon oxide layer using a CVD process and etching back using an anisotropic dry etching process. In this case, an opening is formed through the isolation insulating layer 14 to partly expose the capacitor electrode 7 by the dry etching process.

Thereafter, N+-type impurity diffusion source/drain regions 12 and 13 are formed for the transfer gate transistor within the silicon substrate 1 by implanting arsenic ions thereinto and performing an annealing operation thereupon.

In FIG. 4L, note that the gate polycrystalline silicon layer 10a is formed simultaneously with the formation of the gate polycrystalline silicon layer 10.

Finally, referring to FIG. 3, a titanium layer is formed on the entire surface by using a sputtering process and then is silicified by heat treatment. That is, silicide layers 16 and 16a are grown respectively on the gate polycrystalline silicon layers 10 and 10a, and a silicide layer 15 is selectively grown on the source/drain region 13 and in the opening of the capacitor electrode 7 as a result of the heat treatment. Thus, an extensive silicification occurs. Note that the capacitor insulating layer 6' formed above the buried silicon oxide layer 5 is interposed between the source/drain region 13 and the capacitor electrode 7. However, in the course of forming the silicide layer 15, silicon atoms may also be diffused into the capacitor insulating layer 6 from the capacitor electrode 7 to silicify the titanium layer on the capacitor insulating layer 6. Therefore, the silicide layer 15 bridges the gap between the source/drain region 13 and the capacitor electrode 7.

Thus, the source/drain region 13 of the transfer gate transistor and the capacitor electrode 7 of the substrate-plate type trench capacitor are electrically connected with each other by means of the silicide layer 15 that is self-aligned relative to the sidewall spacers 11.

A second method for manufacturing the memory cell of FIG. 3 will be explained next with reference to FIGS. 5A through 5G.

Figure 5A:
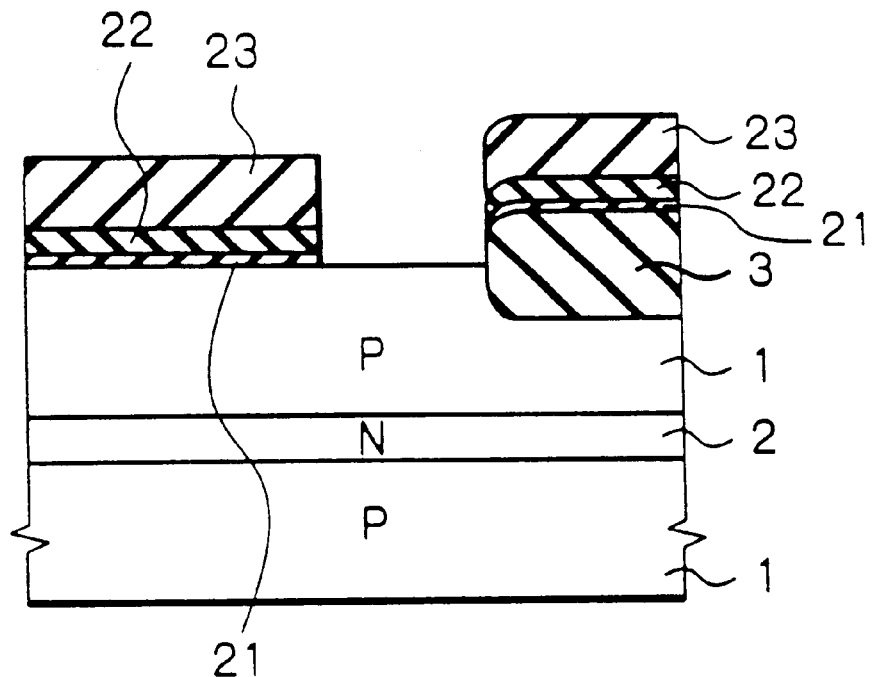
FIGS. 5A through 5G are cross-sectional views for explaining a second method for manufacturing the memory cell of FIG. 3.
Figure 5B:
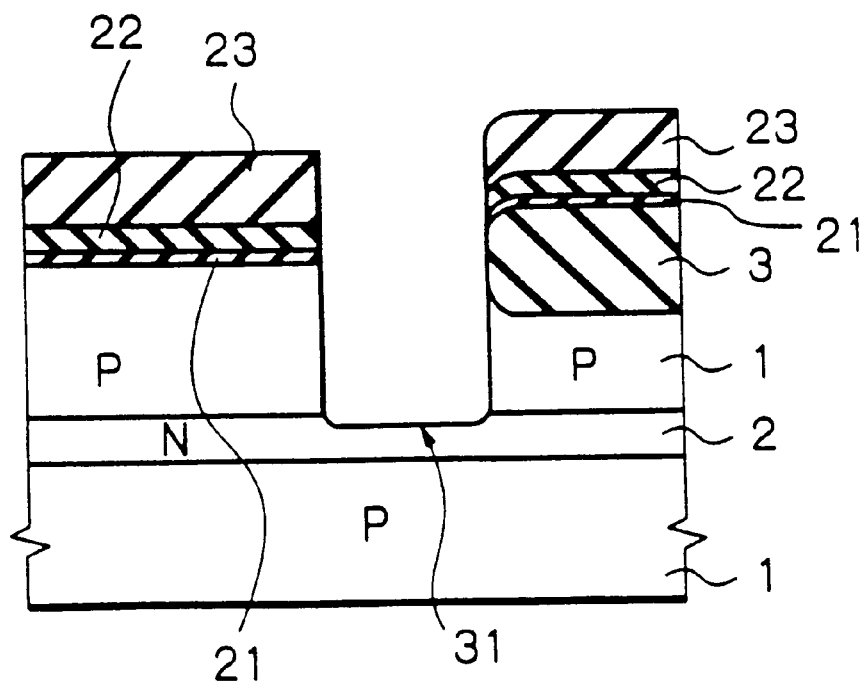

First, referring to FIG. 5A, in a similar way to FIG. 4A, phosphorus ions are implanted at an energy of about 500 keV to 1 MeV into a P-type monocrystalline silicon substrate 1, and an annealing operation is performed thereupon. Thus, a substrate plate electrode 2 having a phosphorus concentration of about $10^{18}$ to $10^{19}$ atoms/cm$^3$ is formed within the silicon substrate 1.

Then, an about 500 nm thick field silicon oxide layer 3 is selectively formed on the surface of the silicon substrate 1 by using a LOCOS process.

Then, an about 20 nm thick silicon oxide layer 21, an about 50 nm thick silicon nitride layer 22 and an about 800 nm thick mask silicon oxide layer 23 are sequentially formed to form a multilayer structure, which is then subjected to a patterning operation as illustrated in FIG. 5A. Next, referring to FIG. 5B, trench 31 is formed within the silicon substrate 1 by an RIE process. The trench 31 has a depth of 0.6 µm.

Figure 5C:
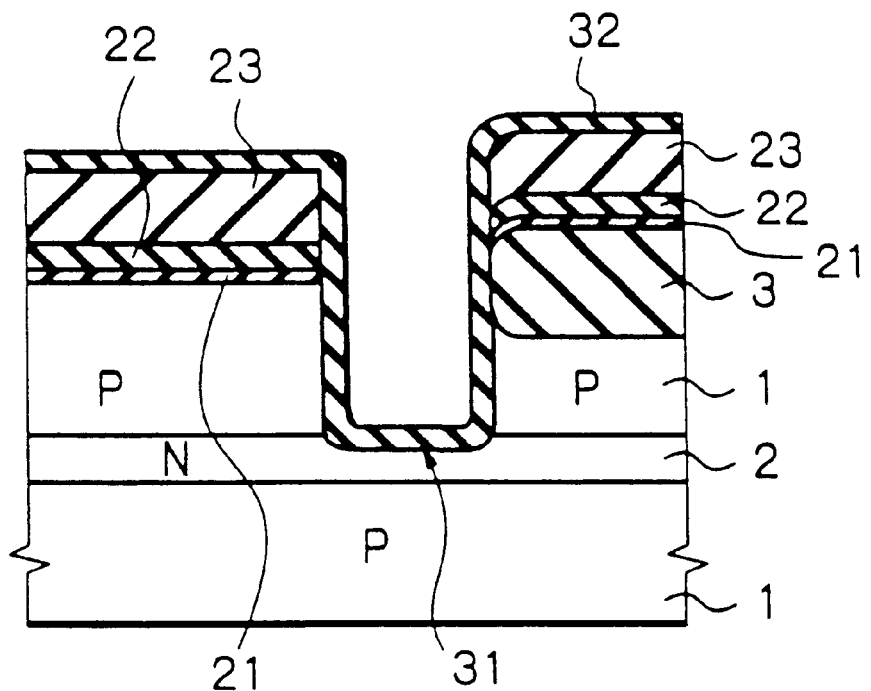

Next, referring to FIG. 5C, an about 100 nm thick silicon oxide layer 32 is deposited on the entire surface by using a CVD process.

Figure 5D:
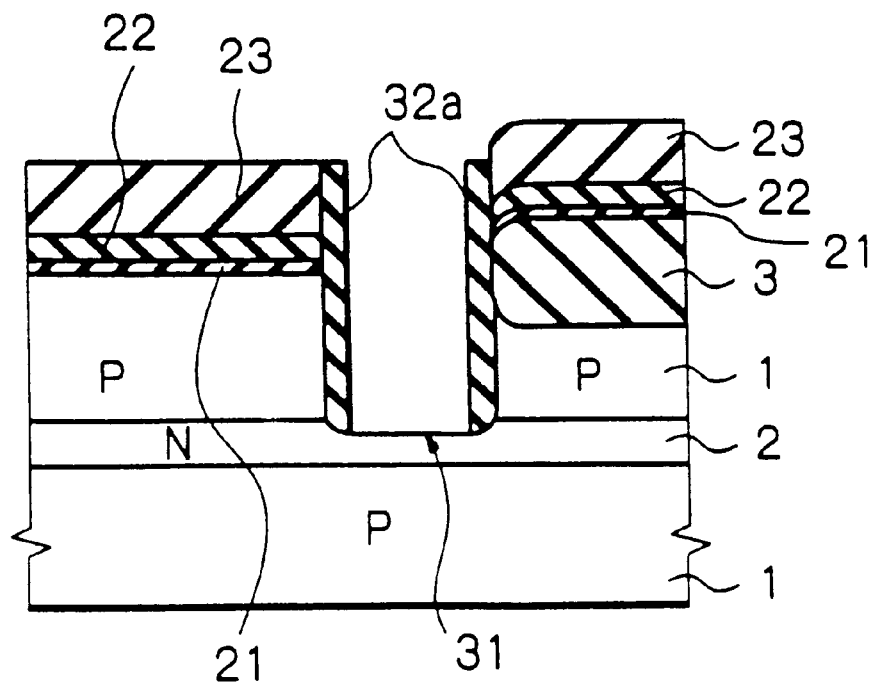

Next, referring to FIG. 5D, the silicon oxide layer 32 is etched back by an anisotropic dry etching process to form a sidewall silicon oxide layer 32a. At this stage, the silicon oxide layer 32 on the bottom of the trench 31 is also removed.

Figure 5E:
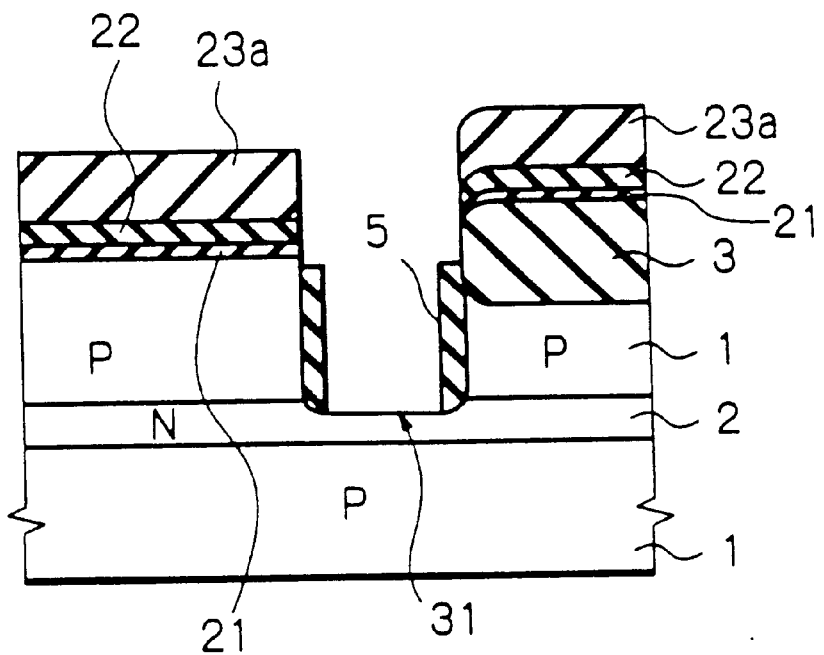

Next, referring to FIG. 5E, the sidewall silicon oxide layer 32a is removed by a thickness of about 100 nm from an upper portion thereof by a dry etching process to form a buried silicon oxide layer 5 on the sidewalls of the trench 31. In this case, the silicon oxide layer 23 is also etched, so that a silicon oxide layer 23a thinner than the silicon oxide layer 23 is obtained.

Figure 5F:
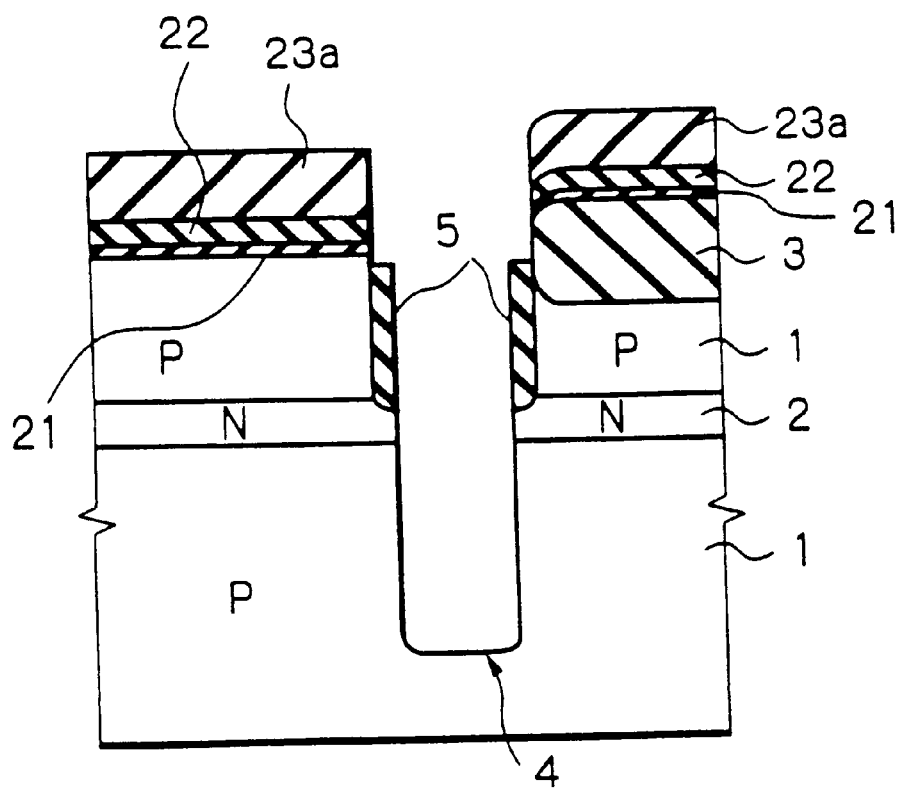

Next, referring to FIG. 5F, the silicon substrate 1 is once again subjected to a dry etching process using an RIE technique to produce a trench 4. The trench 4 has a depth of about 10 µm.

Figure 5G:
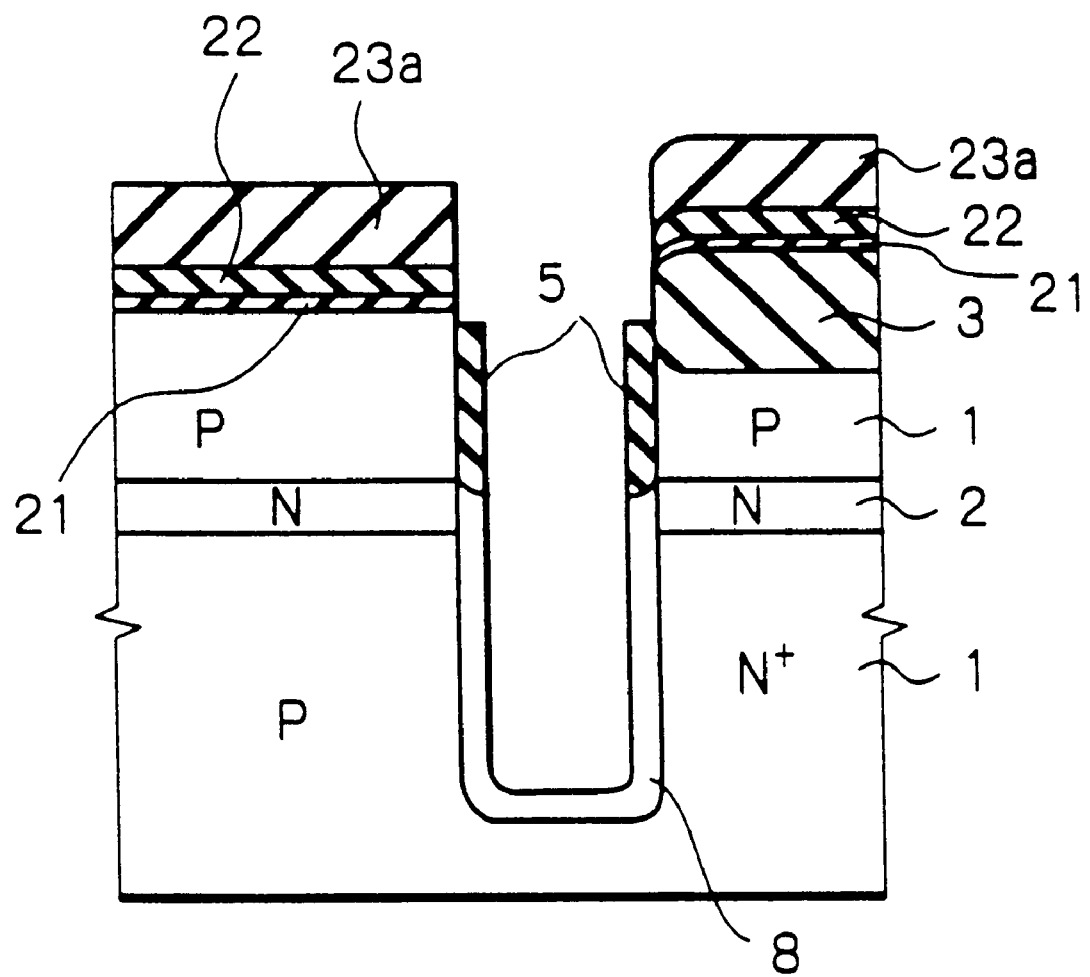

Next, referring to FIG. 5G, phosphorus ions are thermally diffused into the substrate plate electrode 2 and the silicon substrate 1. As a result, a substrate-side capacitor electrode 8 is formed on the inner wall of the trench 4.

All the subsequent steps are the same as those described in the first method by referring to FIGS. 4I, 4J, 4K and 4L as well as FIG. 3.

In the second method as illustrated in FIGS. 5A through 5G, the buried silicon oxide layer 5 can be made to be thicker than in the first method as illustrated in FIGS. 4A through 4L. In the first method, if it is tried to increase the thickness of the buried silicon oxide layer 5, the sidewalls of the trench 26 can give rise to crystal defects because the silicon oxide layer 5 is formed by a thermal oxidation process. Thus, by increasing the thickness of the buried silicon oxide layer 5, any parasitic MOS transistor can be completely prevented from appearing to eliminate any leak current between the source/drain region 13 and the substrate plate electrode 2 and prolong the retention time for which the memory cell can store information.

A third method for manufacturing the memory cell of FIG. 3 will be explained next with reference to FIGS. 6A through 6G.

Figure 6A:
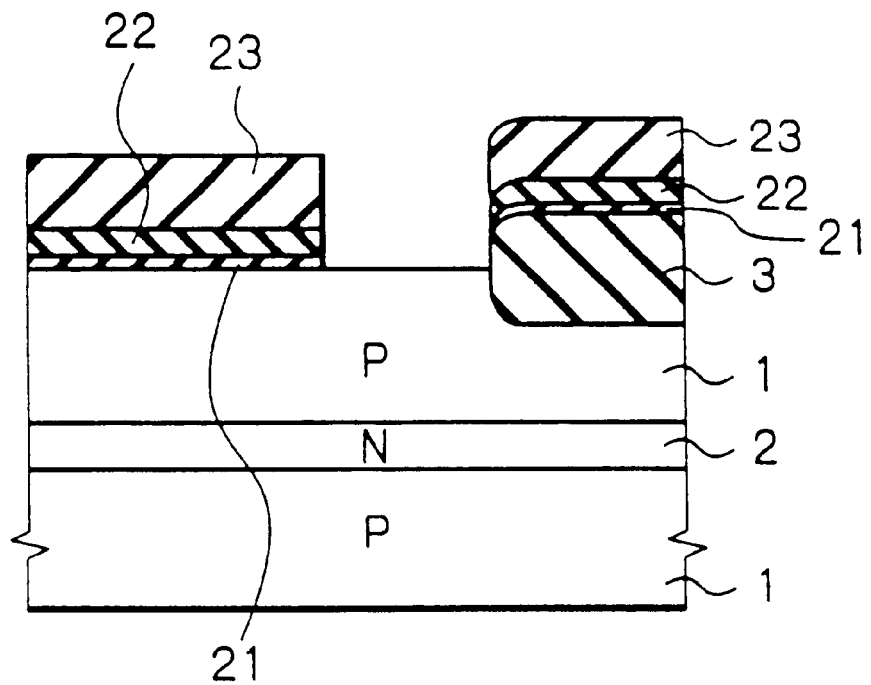
FIGS. 6A through 6F are cross-sectional views for explaining a third method for manufacturing the memory cell of FIG. 3.
Figure 6B:
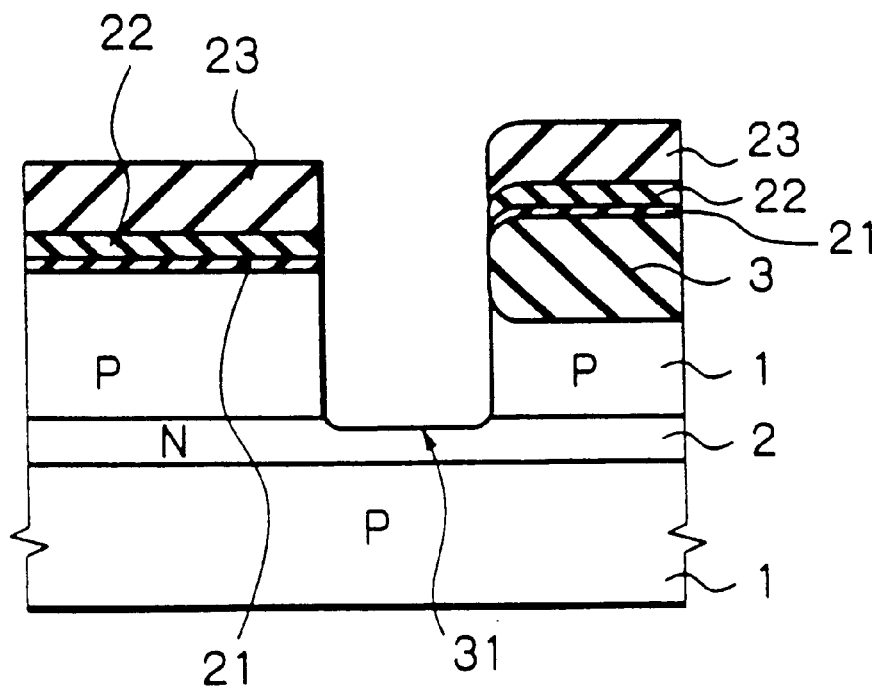

First, referring to FIG. 6A, in a similar way to FIG. 5A, phosphorus ions are implanted at an energy of about 500 keV to 1 MeV into a P-type monocrystalline silicon substrate 1, and an annealing operation is performed thereupon. Thus, a substrate plate electrode 2 having a phosphorus concentration of about $10^{18}$ to $10^{19}$ atoms/cm$^3$ is formed within the silicon substrate 1.

Then, an about 500 nm thick field silicon oxide layer 3 is selectively formed on the surface of the silicon substrate 1 by using a LOCOS process.

Then, an about 5 nm thick silicon oxide layer 21, an about 100 nm thick silicon nitride layer 22 and an about 500 µm thick mask silicon oxide layer 23 are sequentially formed to form a multilayer structure, which is then subjected to a patterning operation as illustrated in FIG. 6A. Next, referring FIG. 6B, in a similar way to FIG. 5B, trench 31 is formed within the silicon substrate 1 by an RIE process. The trench 31 has a depth of 0.5 µm.

Figure 6C:
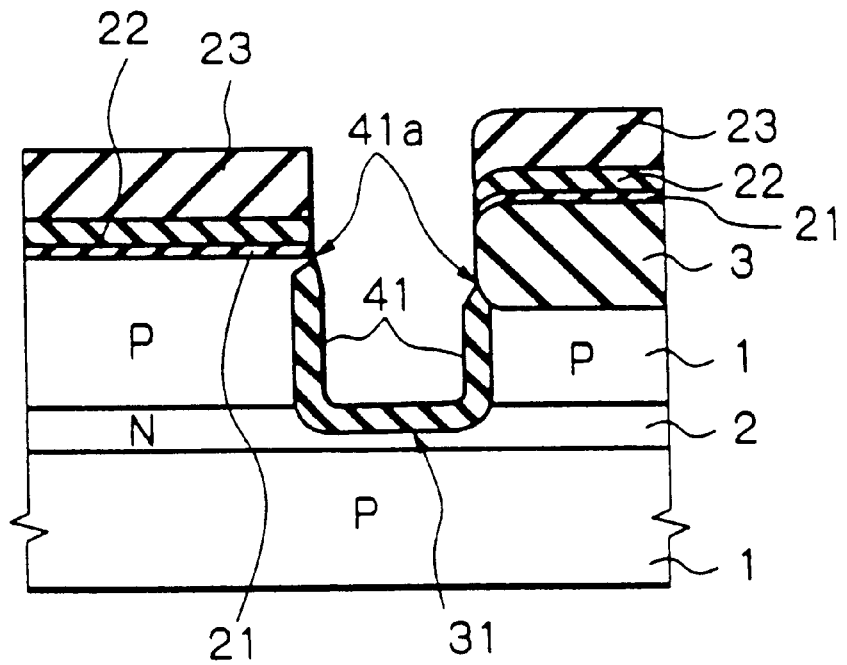

Next, referring to FIG. 6C, the silicon substrate 1 and the substrate plate electrode 2 are thermally oxidized, so that an about 50 nm thick silicon oxide layer 41 is formed on the sidewalls of the trench 31. Since the thickness of the silicon oxide layer 21 is smaller than that of the silicon oxide layer 41, large stress appears in this region which produces a long bird's beak 41a in the region. The bird's beak 41a has a length of about 50 nm.

Figure 6D:
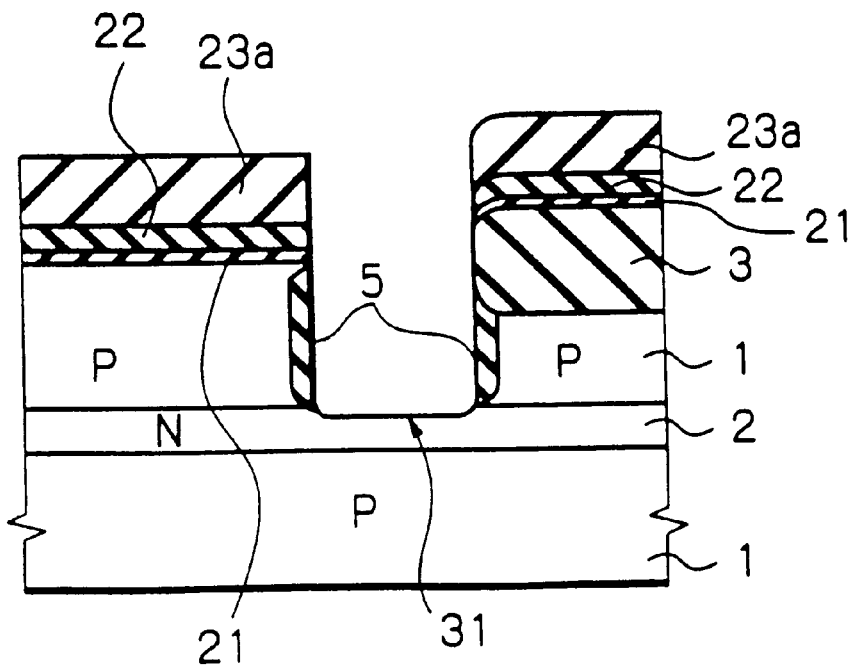

Next, referring to FIG. 6D, in a similar way to FIG. 5D, the silicon oxide layer 41 is etched back by an anisotropic dry etching to form a buried silicon oxide layer 5. At this stage, the silicon oxide layer 41 on the bottom of the trench 31 is removed, and the buried silicon oxide layer 41 is buried in the silicon substrate 1 with its top located at a depth of 500 nm from the main surface of the silicon substrate 1.

In this case, the silicon oxide layer 23 is also etched, so that a silicon oxide layer 23a thinner than the silicon oxide layer 23 is obtained.

Figure 6E:
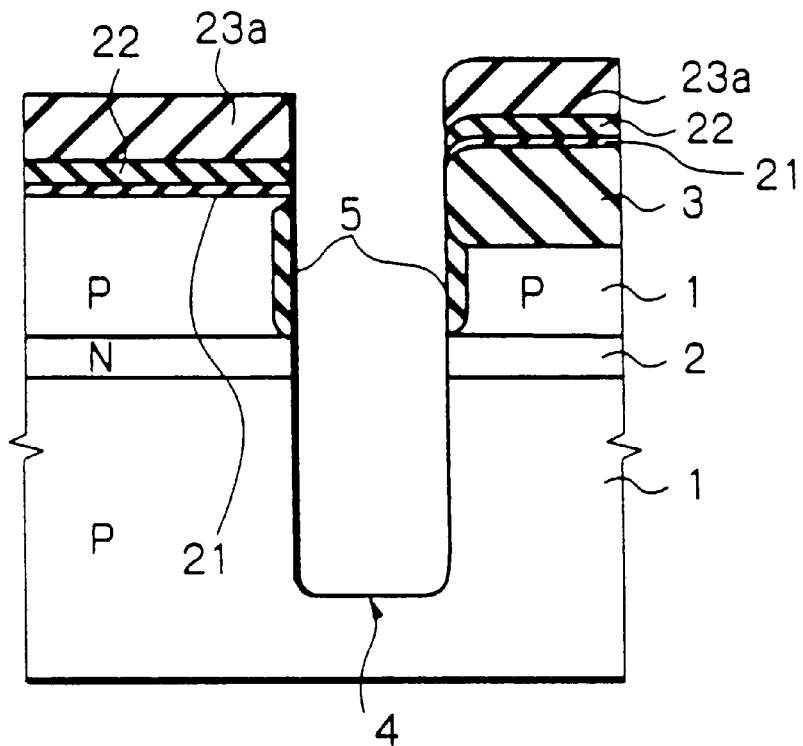

Next, referring to FIG. 6E, in a similar way to FIG. 5F, the silicon substrate 1 is once again subjected to a dry etching process using an RIE technique to produce a trench 4. The trench 4 has a depth of about 5 µm.

Figure 6F:
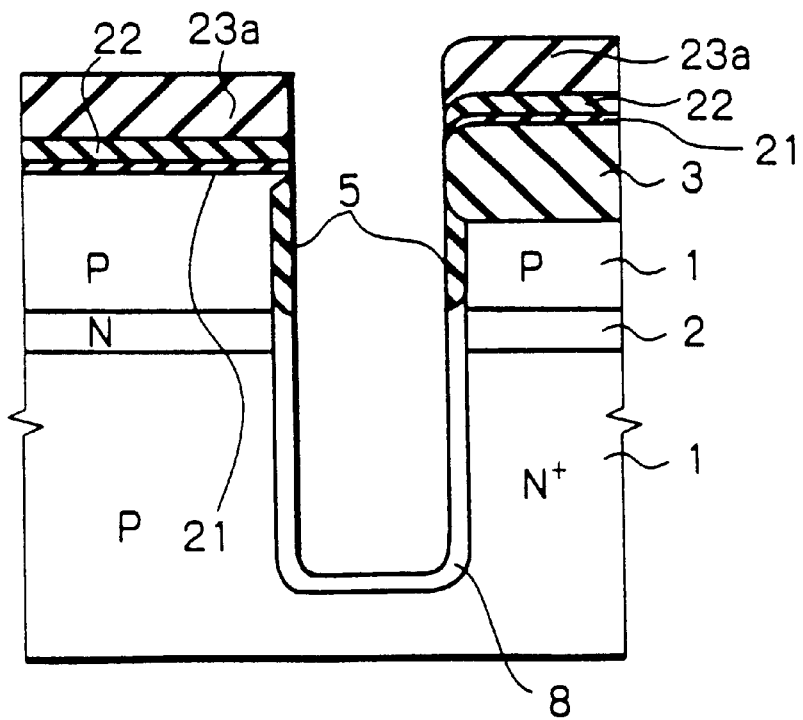

Next, referring to FIG. 6F, in the same way as in FIG. 5G, phosphorus ions are thermally diffused into the substrate plate electrode 2 and the silicon substrate 1. As a result, a substrate-side capacitor electrode 8 is formed on the inner wall of the trench 4.

All the subsequent steps are the same as those described in the first method by referring to FIGS. 4I, 4J, 4K and 4L as well as FIG. 3.

In the third method as illustrated in FIGS. 6A through 6F, the buried silicon oxide layer 5 is formed by making use of the formation of a bird's beak. Therefore, the process of forming the buried silicon oxide layer 5 is further simplified from the above-mentioned first and second methods to make the manufacturing method even more reliable.

A fourth method for the manufacturing the memory cell of FIG. 3 will be explained next with reference to FIGS. 7A through 7H. The fourth method differs from the first method only in that the substrate side capacitor electrode 8 can be made to show a relatively small resistance.

The steps as illustrated in FIGS. 7A through 7E are the same as those as illustrated in FIGS. 4A through 4E, respectively.

Figure 7A:
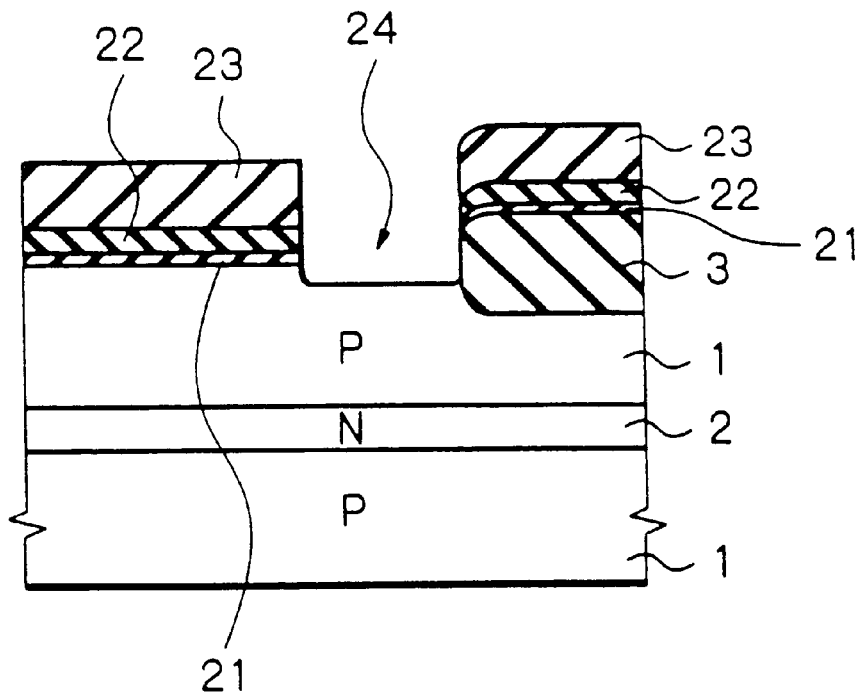
FIGS. 7A through 7I are cross-sectional views for explaining a fourth method for manufacturing the memory cell of FIG. 3.
Figure 7B:
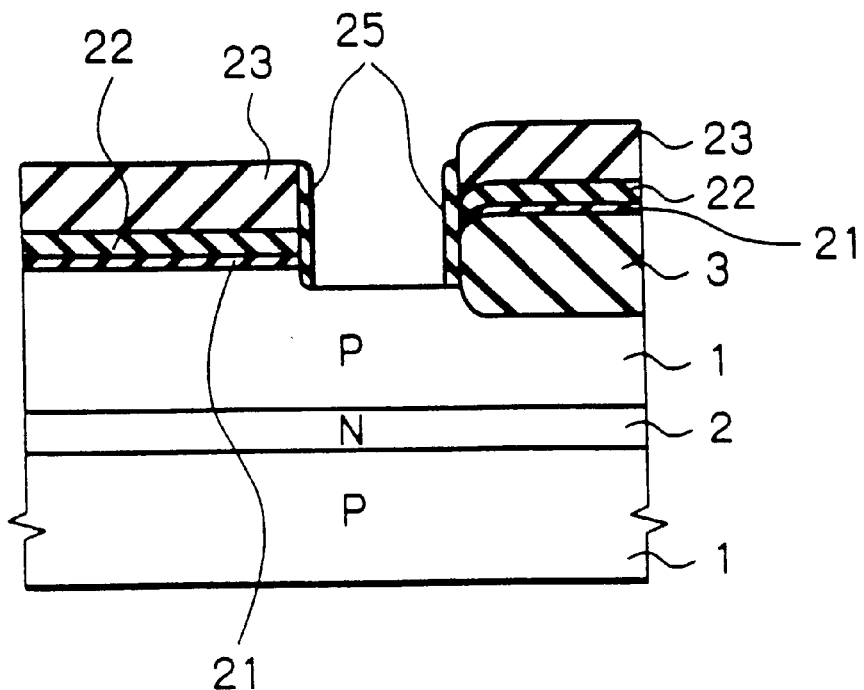
Figure 7C:
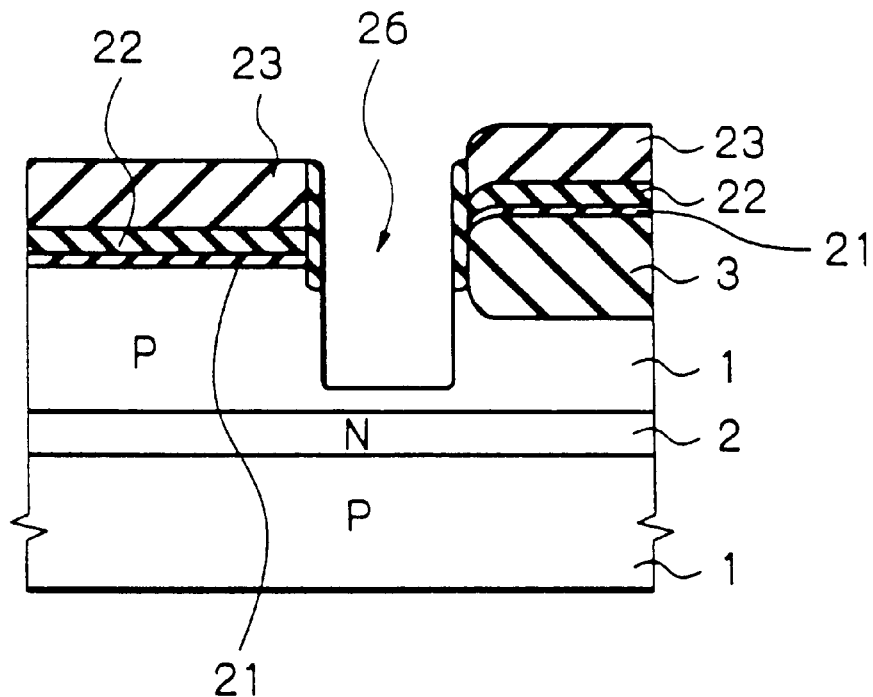
Figure 7D:
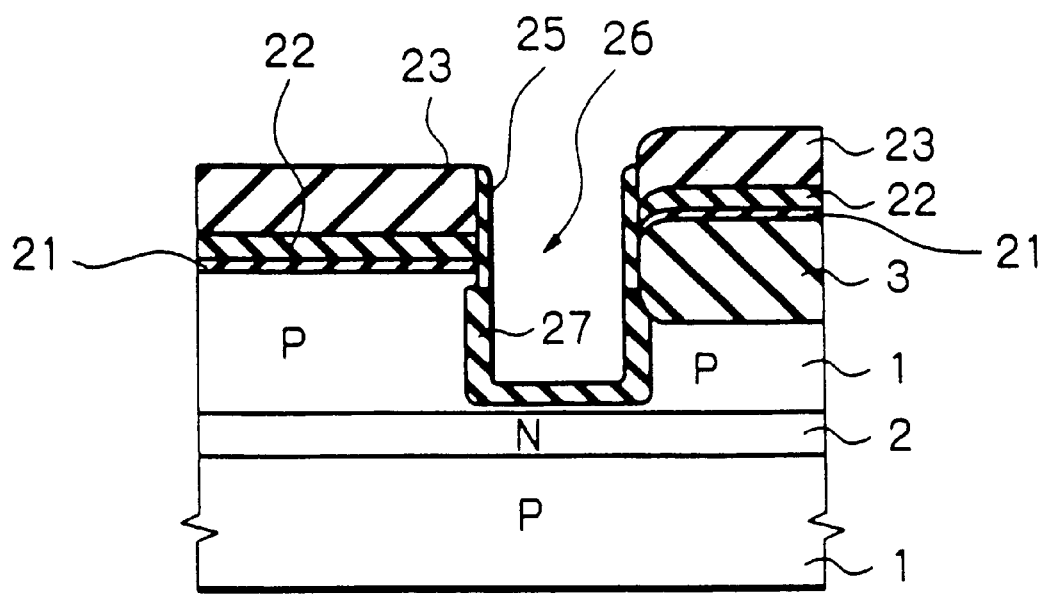
Figure 7E:
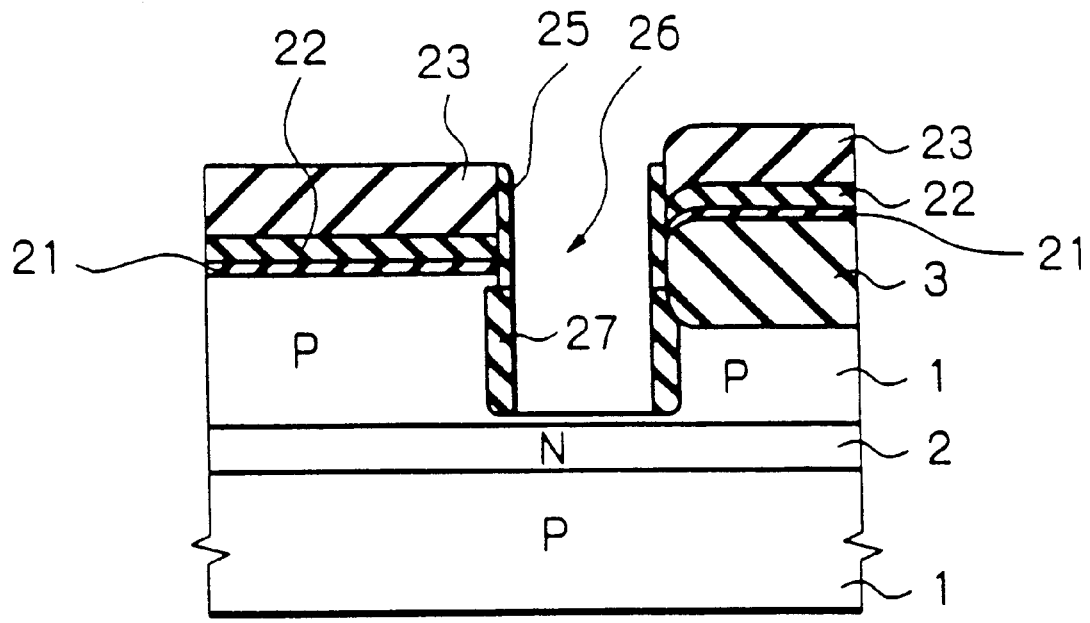
Figure 7F:
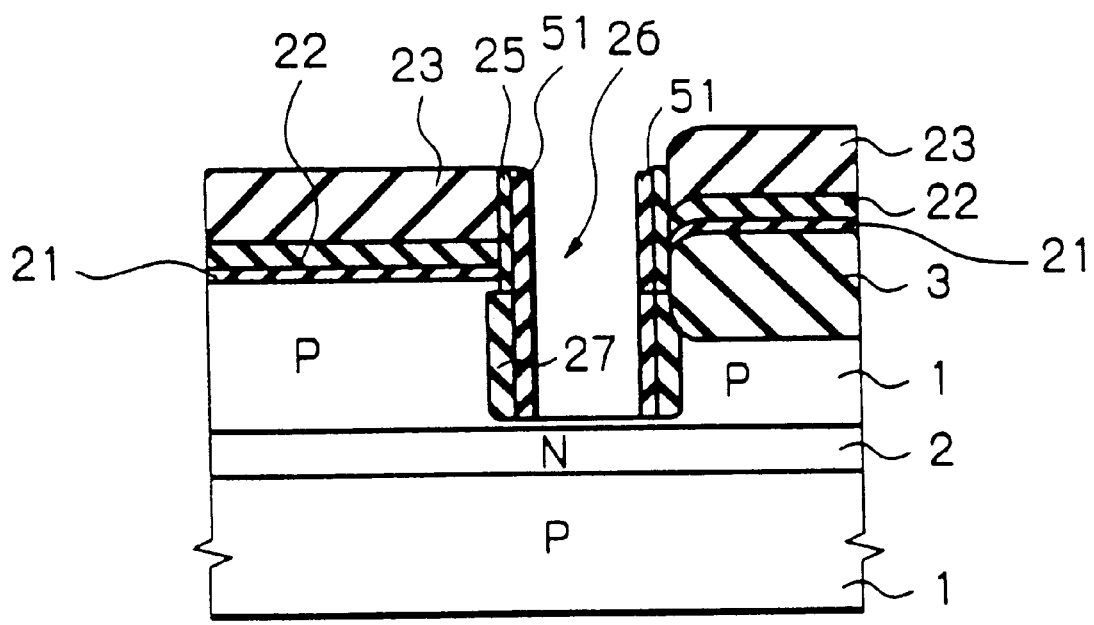

Next, referring to FIG. 7F, an about 50 nm thick sidewall silicon nitride layer 51 is formed on the surfaces of the sidewall silicon nitride layer 25 and the silicon oxide layer 27. More specifically, the silicon nitride layer 51 is an about 50 nm thick silicon nitride layer that is formed on the entire surface, and is subsequently etched back in an appropriate manner.

Figure 7G:
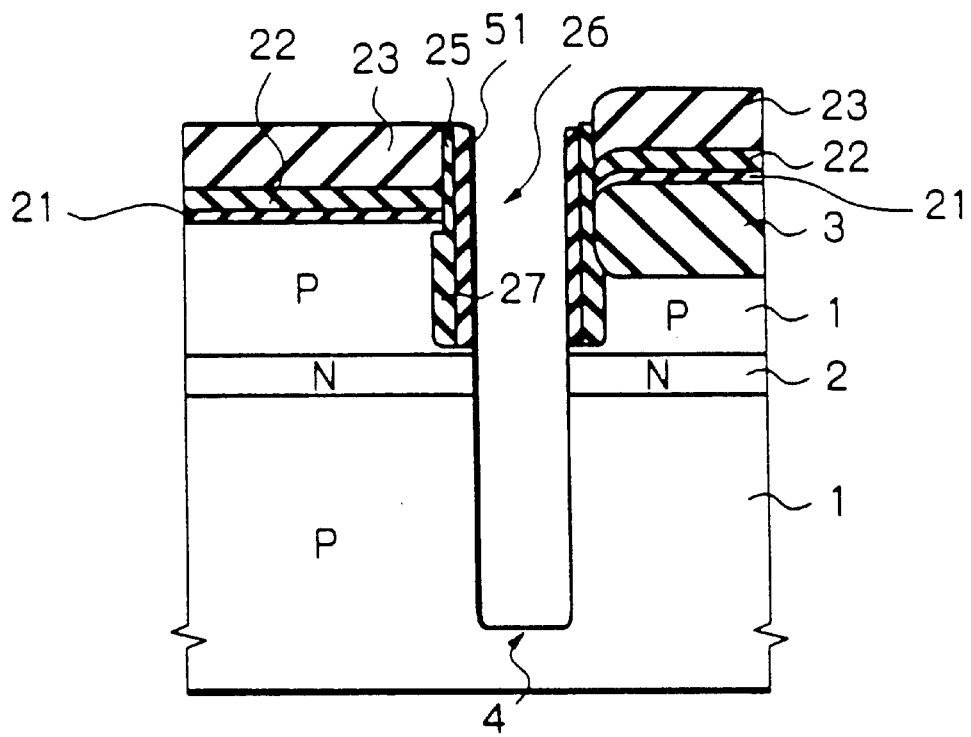

Next, referring to FIG. 7G, in a similar way to FIG. 4F, the silicon substrate 1 is once again subjected to a dry etching process using an RIE technique to produce a trench 4. The trench 4 has a depth of about 5 $\mu$m.

Figure 7H:
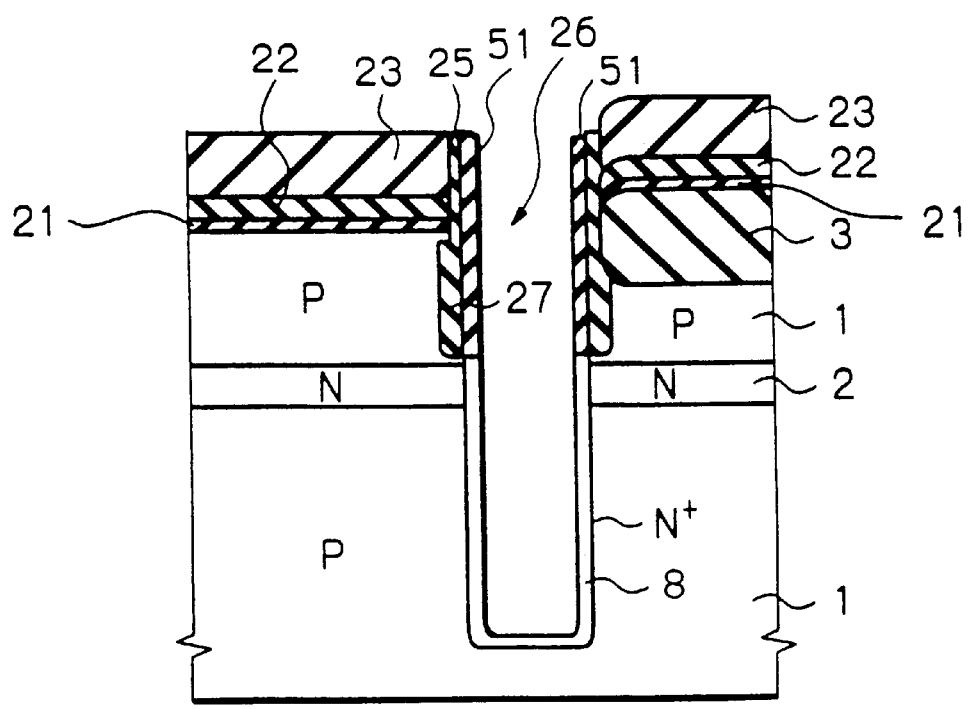

Next, referring to FIG. 7H, phosphorus ions are diffused until a high concentration level is realized by using the mask silicon oxide layer 23 and the sidewall silicon nitride layer 51 as a diffusion mask. The phosphorus ion diffusion process is carried out at a high temperature of about 900° C. for a relatively long time. As a result, a relatively deep diffusion layer is generated as a substrate-side capacitor electrode 8 on the inner wall of the trench 4. Therefore, the substrate-side capacitor shows relatively small resistance. In this case, the sidewall silicon nitride layer 51 is used to prevent the surface region of the silicon oxide layer 27 from being transformed into phosphorus glass. If the surface region of the silicon oxide layer 27 is turned into phosphorus glass, it will be removed in a subsequent processing step using a fluoric acid solution to make the buried silicon oxide layer 5 (see FIG. 7I) have a very thin film thickness so that the leak current due to a parasitic MOS transistor will be increased which reduces the time for which the memory cell can store information. However, such inconveniences are prevented from occurring by forming the sidewall silicon nitride layer 51.

Figure 7I:
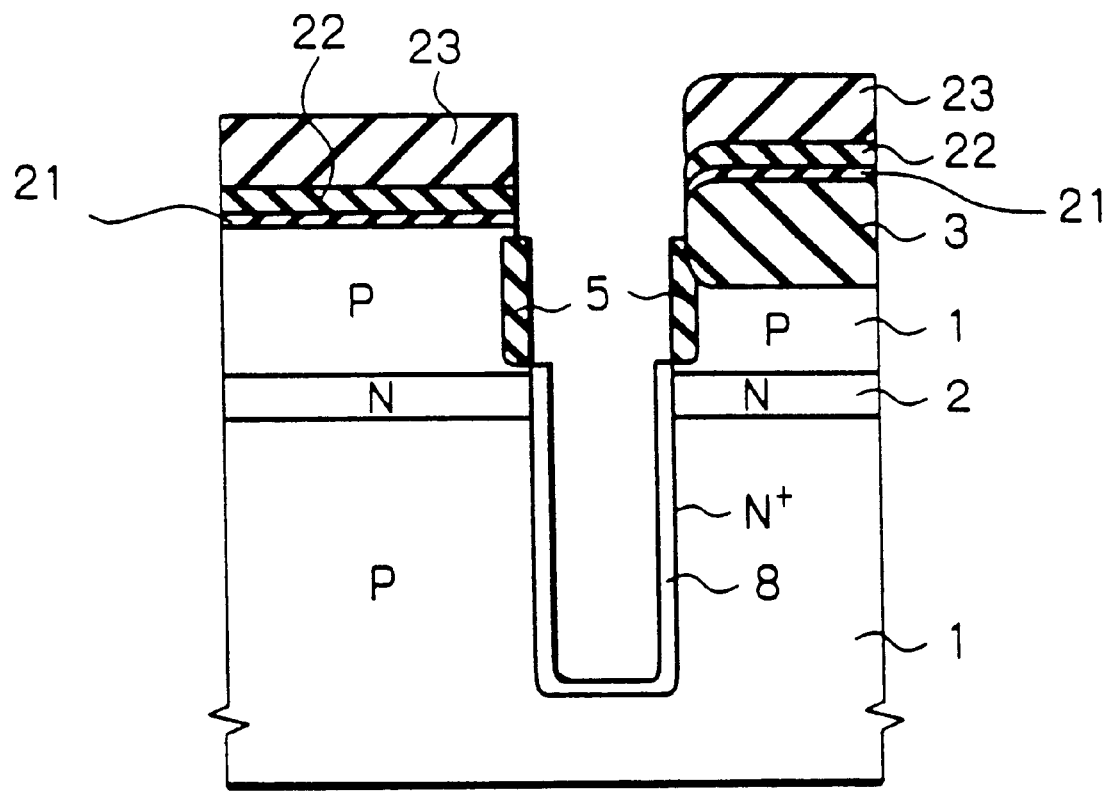

Next, referring to FIG. 7I, in a similar way to FIG. 4H, the sidewall silicon nitride layers 25 and 51 are removed by means of hot phosphoric acid solution. As a result, the silicon oxide layer 27 is buried as a buried silicon oxide layer 5.

All the subsequent steps are the same as those described in the first method by referring to FIGS. 4I, 4J, 4K and 4L as well as FIG. 3.

Figure 8:
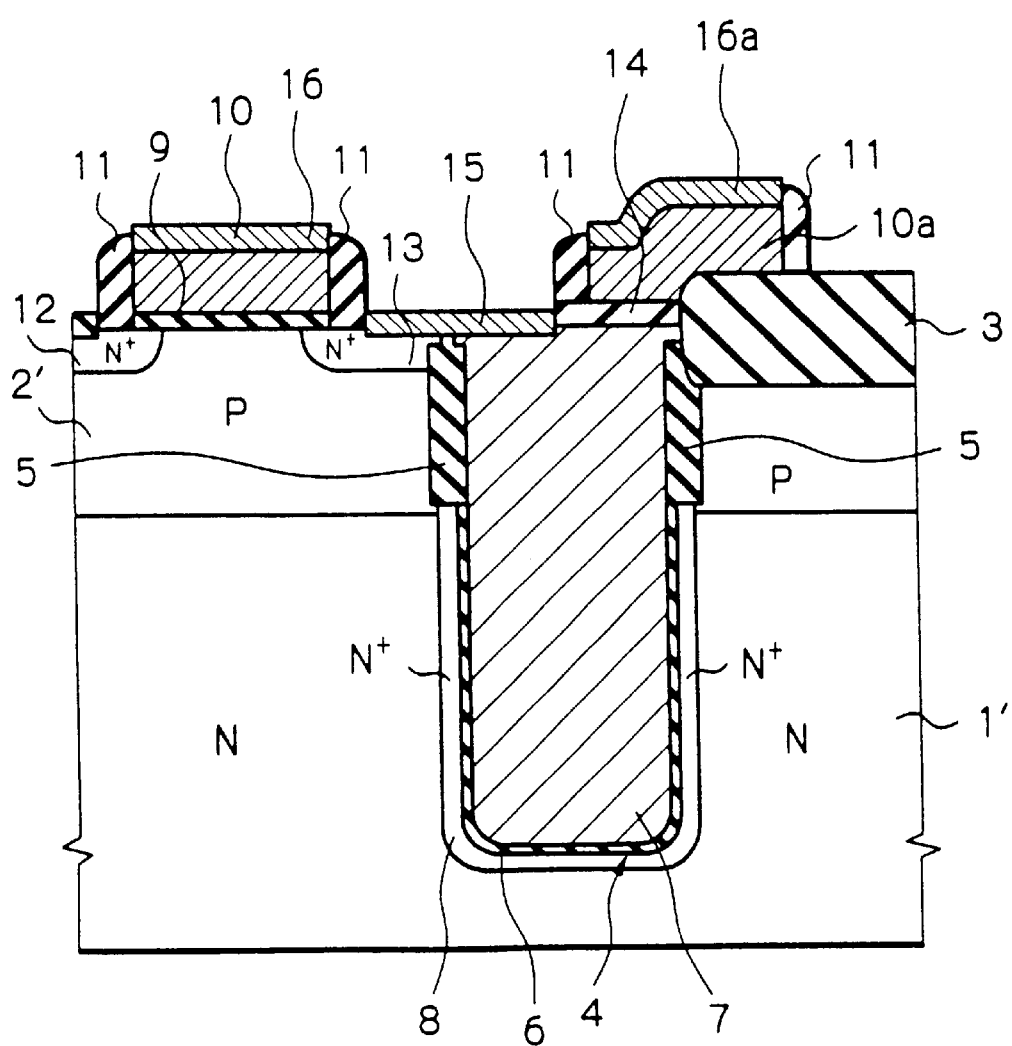
FIG. 8 is a cross-sectional view illustrating a modification of the memory cell of FIG. 3.

In FIG. 8, which illustrates a modification of the memory cell of FIG. 3, boron ions may be implanted into an N-type monocrystalline silicon substrate 1' through the entire surface thereof and the substrate 1' may be heat-treated to realize a P-type impurity diffusion region 2' having a boron impurity concentration of between $10^{17}$ and $18^{18}$ atoms/cm$^3$ on the surface of the silicon substrate 1'. The present invention can also be applied to the memory cell of FIG. 8.

In addition, the gate of the transfer gate transistor is formed by using a gate polycrystalline silicon gate prior to the salicification of the transfer gate transistor. It should be noted that the present invention is applicable if the gate is made of tungsten polycide. It should also be noted that the silicide layer may be formed by silicide of refractory metal such as cobalt silicide instead of titanium silicide.

As explained hereinabove, according to the present invention, the gap between a transfer gate transistor and a substrate-plate type trench capacitor can be minimized to facilitate the effort of down-sizing a memory cell and remarkably improve the reliability of the memory cell. Additionally, the process of manufacturing the buried silicon oxide layer of the memory cell can be very simple and highly reliable, thus reducing the manufacturing cost. Thus, the present invention can remarkably promote the trend of super-integration and densification of DRAMs.

What is claimed is:

1. A method for manufacturing a semiconductor memory device, comprising the steps of:

forming a mask insulating layer having an opening on a semiconductor substrate;

perforating a first trench within said semiconductor substrate by using said mask insulating layer as a mask;

forming a sidewall oxidation-resistant layer on a sidewall of said first trench;

perforating a second trench within said semiconductor substrate by using said sidewall oxidation-resistant layer as a mask;

performing a thermal oxidizing operation upon said semiconductor substrate by using said sidewall oxidation-resistant layer as a mask, so that a buried silicon oxide layer is formed within said second trench;

removing a bottom portion of said buried silicon oxide layer by using a dry etching process;

perforating a third trench within said semiconductor substrate by using said sidewall oxidation-resistant layer and said buried silicon oxide layer as a mask;

forming a substrate-side capacitor electrode within said semiconductor substrate on an inner surface of said third trench;

removing said sidewall oxidation-resistant layer after said substrate-side capacitor electrode is formed;

forming a capacitor insulating layer on said substrate-side capacitor electrode after said oxidation-resistant layer is removed;

burying a capacitor electrode in said first, second and third trenches after said capacitor insulating layer is formed;

forming first and second source/drain regions within said semiconductor substrate, said second source/drain region being in contact with said capacitor electrode through said buried silicon oxide layer; and growing a silicide layer on said second source/drain region and said capacitor electrode.

2. The method as set forth in claim 1, wherein said substrate-side capacitor electrode forming step comprises a step of implanting impurity ions by a rotational oblique ion implantation process.

3. A method for manufacturing a semiconductor memory device, comprising the steps of:

forming a mask insulating layer having an opening on a semiconductor substrate;

perforating a first trench within said semiconductor substrate by using said mask insulating layer as a mask;

forming a sidewall silicon oxide layer on a sidewall of said first trench;

removing a top portion said sidewall silicon oxide layer so that a buried silicon oxide layer lower than a top surface of said semiconductor substrate is obtained;

perforating a second trench within said semiconductor substrate by using said buried silicon oxide layer as a mask;

forming a substrate-side capacitor electrode within said semiconductor substrate on an inner surface of said second trench;

forming a capacitor insulating layer on said substrate-side capacitor electrode;

burying a capacitor electrode in said first and second trenches after said capacitor insulating layer is formed;

forming first and second source/drain regions within said semiconductor substrate, said second source/drain region being in direct contact with said capacitor electrode over said buried silicon oxide layer; and growing a silicide layer on said second source/drain region and said capacitor electrode.

4. The method as set forth in claim 3, wherein said substrate-side capacitor electrode forming step comprises a step of thermally introducing impurity ions into said semiconductor substrate.

5. A method for manufacturing a semiconductor memory device, comprising the steps of:

forming a mask insulating layer including an oxidation-resistant layer and having an opening on a semiconductor substrate;

perforating a first trench within said semiconductor substrate by using said mask insulating layer as a mask;

performing a thermal oxidizing operation upon said semiconductor substrate by using said mask insulating layer as a mask, so that a thermally-grown silicon oxide layer having a bird's beak is formed within said first trench;

removing a bottom portion of said thermally-grown silicon oxide layer by using a dry etching process;

perforating a second trench within said semiconductor substrate by using said thermally-grown silicon oxide layer as a mask, so that said thermally-grown silicon oxide layer becomes a buried oxide layer;

forming a substrate-side capacitor electrode within said semiconductor substrate on an inner surface of said second trench;

forming a capacitor insulating layer on said substrate-side capacitor electrode;

burying a capacitor electrode in said first and second trenches after said capacitor insulating layer is formed;

forming first and second source/drain regions within said semiconductor substrate, said second source/drain region being in contact with said capacitor electrode through said buried silicon oxide layer; and growing a silicide layer on said second source/drain region and said capacitor electrode.

6. The method as set forth in claim 1, wherein said substrate-side capacitor electrode forming step comprises a step of thermally introducing impurity ions into said semiconductor substrate.

7. A method for manufacturing a semiconductor memory device, comprising the steps of:

forming a mask insulating layer having an opening on a semiconductor substrate;

perforating a first trench within said semiconductor substrate by using said mask insulating layer as a mask;

forming a first sidewall oxidation-resistant layer on a sidewall of said first trench;

perforating a second trench within said semiconductor substrate by using said first sidewall oxidation-resistant layer as a mask;

performing a thermal oxidizing operation upon said semiconductor substrate by using said first sidewall oxidation-resistant layer as a mask, so that a buried silicon oxide layer is formed within said second trench;

removing a bottom portion of said buried silicon oxide layer by using a dry etching process;

forming a second sidewall oxidation-resistant layer on said first sidewall oxidation-resistant layer and said buried silicon oxida layer after the bottom portion of said buried silicon oxida layer is removed;

perforating a third trench within said semiconductor substrate by using said second sidewall oxidation-resistant layer as a mask;

forming a substrate-side capacitor electrode within said semiconductor substrate on an inner surface of said third trench;

removing said first and second sidewall oxidation-resistant layers after said substrate-side capacitor electrode is formed;

forming a capacitor insulating layer on said substrate-side capacitor electrode after said first and second oxidation-resistant layers are removed;

burying a capacitor electrode in said first, second and third trenches after said capacitor insulating layer is formed;

forming first and second source/drain regions within said semiconductor substrate, said second source/drain region being in contact with said capacitor electrode through said buried silicon oxide layer; and growing a silicide layer on said second source/drain region and said capacitor electrode.

8. The method as set forth in claim 7, wherein said substrate-side capacitor electrode forming step comprises a step of thermally introducing impurity ions into said semiconductor substrate.

* * * * *